(12) United States Patent
Li et al.

(10) Patent No.: US 12,354,887 B2
(45) Date of Patent: Jul. 8, 2025

(54) CLEANING METHOD, METHOD OF MANUFACTURING SEMICONDUCTOR DEVICE, AND SUBSTRATE PROCESSING APPARATUS

(71) Applicant: KOKUSAI ELECTRIC CORPORATION, Tokyo (JP)

(72) Inventors: Gen Li, Toyama (JP); Hirohisa Yamazaki, Toyama (JP); Kenichi Suzaki, Toyama (JP); Yuji Takebayashi, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 839 days.

(21) Appl. No.: 17/190,958

(22) Filed: Mar. 3, 2021

(65) Prior Publication Data
US 2021/0193486 A1  Jun. 24, 2021

Related U.S. Application Data

(63) Continuation of application No. PCT/JP2019/033886, filed on Aug. 29, 2019.

(30) Foreign Application Priority Data

Sep. 5, 2018  (JP) .................. 2018-165638

(51) Int. Cl.
*H01L 21/67* (2006.01)
*C23C 16/40* (2006.01)
(Continued)

(52) U.S. Cl.
CPC ........ *H01L 21/67017* (2013.01); *C23C 16/40* (2013.01); *C23C 16/4405* (2013.01); *H01L 21/02189* (2013.01); *H01L 21/67011* (2013.01)

(58) Field of Classification Search
None
See application file for complete search history.

(56) References Cited

U.S. PATENT DOCUMENTS

2004/0129671 A1* 7/2004 Ji ..................... B08B 7/00
216/58
2009/0071505 A1  3/2009 Miya et al.
(Continued)

FOREIGN PATENT DOCUMENTS

JP  H07-135196 A  5/1995
JP  2009-076590 A  4/2009
(Continued)

OTHER PUBLICATIONS

PCT/JP2019/033886 International Search Report, Nov. 5, 2019, 2pgs.
(Continued)

*Primary Examiner* — Eric W Golightly
*Assistant Examiner* — Arlyn I Rivera-Cordero
(74) *Attorney, Agent, or Firm* — Volpe Koenig

(57) ABSTRACT

There is provided a technique that includes: (a) supplying a chlorine-containing gas to an interior of a process vessel, to which an oxide film adheres, under a first pressure; (b) exhausting the interior of the process vessel; (c) supplying an oxygen-containing gas into the process vessel; (d) exhausting the interior of the process vessel; (e) supplying the chlorine-containing gas into the process vessel under a second pressure lower than the first pressure; (f) exhausting the interior of the process vessel; (g) supplying the oxygen-containing gas into the process vessel; and (h) exhausting the interior of the process vessel, wherein the oxide film which adheres to the interior of the process vessel is removed by performing each of (a) to (h) one or more times and setting a supply amount of the oxygen-containing gas in
(Continued)

(c) different from a supply amount of the oxygen-containing gas in (g).

15 Claims, 12 Drawing Sheets

(51) Int. Cl.
*C23C 16/44* (2006.01)
*H01L 21/02* (2006.01)

(56) References Cited

U.S. PATENT DOCUMENTS

2013/0260566 A1* 10/2013 Yamazaki ............... C23C 16/54
                                                              134/22.18
2016/0362784 A1    12/2016  Isobe et al.

FOREIGN PATENT DOCUMENTS

| JP | 5011148 B | 8/2012 |
|----|-----------|--------|
| JP | 2017-005090 A | 1/2017 |

OTHER PUBLICATIONS

Korean Office Action issued on Jan. 12, 2023 for Korean Patent Application No. 10-2021-7006073, 8 Pages.

* cited by examiner

Vapor pressure of Hf compound

Vapor pressure of Zr compound

Vapor pressure of Al compound

CLEANING METHOD, METHOD OF MANUFACTURING SEMICONDUCTOR DEVICE, AND SUBSTRATE PROCESSING APPARATUS

CROSS-REFERENCE TO RELATED APPLICATION

The application is a Bypass Continuation Application of PCT International Application No. PCT/JP2019/033886, filed on Aug. 29, 2019 and designating the United States, the international application being based upon and claiming the benefit of priority from Japanese Patent Application No. 2018-165638, filed on Sep. 5, 2018, the entire content of which is incorporated herein by reference.

TECHNICAL FIELD

The present disclosure relates to a cleaning method, a method of manufacturing a semiconductor device, and a substrate processing apparatus.

BACKGROUND

In the related art, recently, an oxide film of a high dielectric constant (high-k) has been used as a gate insulating film as a density of a semiconductor device increases. Further, the oxide film of high dielectric constant is also applied to increase a capacity of a DRAM capacitor. The oxide film of high dielectric constant may require film formation at low temperatures, and may further require a film-forming method with excellent surface flatness characteristics, recess embedding characteristics, and step coverage characteristics while having less foreign matter. Recently, a method of removing films deposited on an inner wall of a reaction tube (inside a process vessel) by gas cleaning has been generally carried out without removing the reaction tube to control the foreign matter. The gas cleaning method includes etching by heat and the like, in which an etching process is performed every time a deposit film of a certain thickness is formed to suppress delamination of the deposit film from the wall of the reaction tube or a jig such as a boat.

In the related art, it has been widely studied to etch an oxide film of high dielectric constant by using a fluorine-containing gas such as $ClF_3$ as a cleaning gas. However, when performing etching with the fluorine-containing gas, fluorides of metal elements forming the oxide film of high dielectric constant may adhere to a surface of the oxide film of high dielectric constant to be etched, making it difficult to remove the oxide film of high dielectric constant. For example, when etching a hafnium oxide film (HfO film) as an oxide film of high dielectric constant, a fluoride of Hf may adhere to a surface of the film to be etched and become an etch stop, making it difficult to remove the HfO film.

SUMMARY

The present disclosure provides some embodiments of a cleaning technique capable of efficiently removing a film such as an oxide film which is difficult to etch with a fluorine-containing gas.

According to some embodiments of the present disclosure, there is provided a technique that includes: (a) supplying a chlorine-containing gas to an interior of a process vessel, to which an oxide film adheres, under a first pressure; (b) exhausting the interior of the process vessel; (c) supplying an oxygen-containing gas into the process vessel; (d) exhausting the interior of the process vessel; (e) supplying the chlorine-containing gas into the process vessel under a second pressure lower than the first pressure; (f) exhausting the interior of the process vessel; (g) supplying the oxygen-containing gas into the process vessel; and (h) exhausting the interior of the process vessel, wherein the oxide film which adheres to the interior of the process vessel is removed by performing each of (a) to (h) one or more times and setting a supply amount of the oxygen-containing gas in (c) different from a supply amount of the oxygen-containing gas in (g).

BRIEF DESCRIPTION OF DRAWINGS

The accompanying drawings, which are incorporated in and constitute a part of the specification, illustrate embodiments of the present disclosure.

FIGS. 1A to 1C are diagrams illustrating a vapor pressure of each compound, in which FIG. 1A illustrates a vapor pressure of a Hf compound, FIG. 1B illustrates a vapor pressure of a Zr compound, and FIG. 1C illustrates a vapor pressure of an Al compound.

DETAILED DESCRIPTION

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1A:
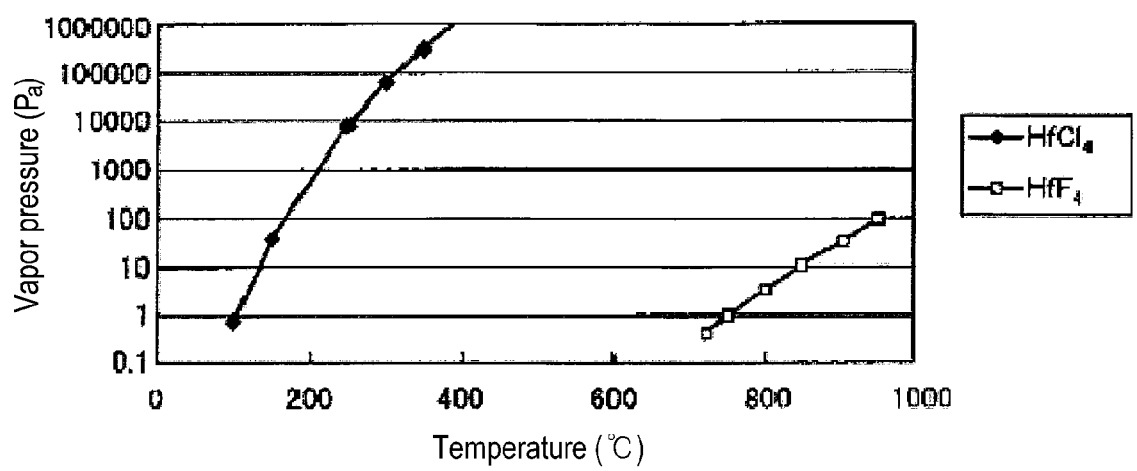
Figure 1B:
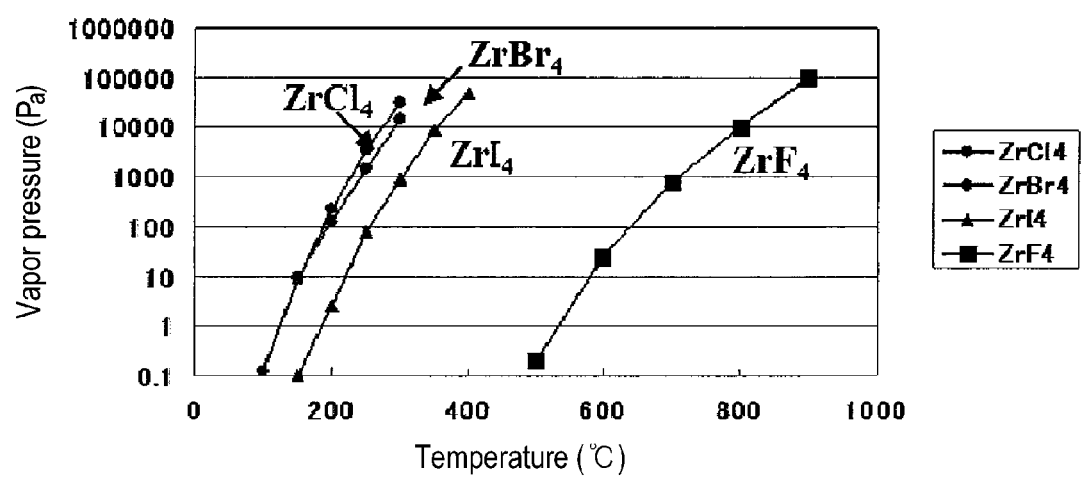
Figure 1C:
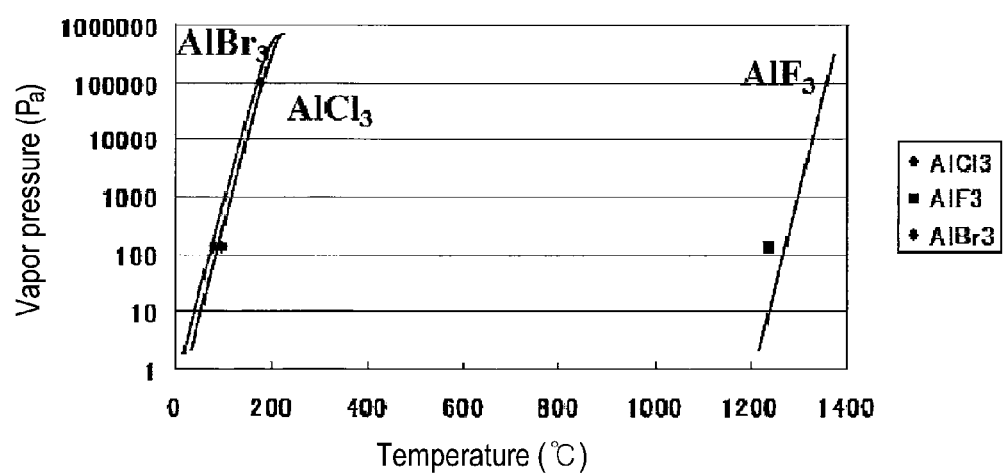

A vapor pressure of a fluoride and a halide (chloride) of hafnium (Hf) is illustrated in FIG. 1A, a vapor pressure of a fluoride and of a halide of zirconium (Zr) is illustrated in FIG. 1B, and a vapor pressure of a fluoride and a halide (a chloride or a bromide) of aluminum (Al) is illustrated in FIG. 1C. In those cases, the vapor pressure of the halide is higher than that of the fluoride, and for example, a chloride or a bromide may be used as a halogen-based gas to perform an etching. Further, as indicated in Table 1 (quoted from CRC Handbook of Chemistry and Physics, 84th, 2004), bond energies of Hf—O and Zr—O are as large as 8.30 eV and 8.02 eV, respectively, and oxides of Hf and Zr are etching-resistant materials. Processes of activating breaking of Hf—O, Zr—O and Al—O bonds, forming each chloride or each bromide of Hf, Zr and Al, and desorbing a reaction product may be performed to proceed with the etching.

TABLE 1

| Bond strength (eV) | | Bond strength (eV) | | Bond strength (eV) | |
|---|---|---|---|---|---|
| Zr—O | 8.02 | Hf—O | 8.30 | Al—O | 5.30 |
| Zr—F | 6.42 | Hf—F | 6.77 | Al—F | 6.90 |
| Zr—Cl | 5.52 | Hf—Cl | 5.16 | Al—Cl | 5.32 |
| Zr—Br | 4.38 | Hf—Br | — | Al—Br | 4.47 |
| Zr—Zr | 3.10 | Hf—Hf | 3.42 | Al—Al | 1.38 |
| Si—O | 8.33 | C—O | 11.21 | C—Cl | 4.13 |
| Si—Cl | 4.23 | C—Si | 4.70 | Cl—Cl | 4.54 |

In this case, when etching is performed with a fluorine-containing gas at a temperature zone of about 800 degrees C. or lower, from the vapor pressure curve of $ZrF_4$ in FIG. 1B, it is considered that $ZrF_4$ is deposited on a surface of a film at the same time as generation of $ZrF_4$. On the other hand, in the case of a Cl-containing gas, it can be seen from the vapor pressure curve of $ZrCl_4$ that it may be similarly deposited on the surface of the film after etching at about 250 degrees C. or lower, but a sufficient vapor pressure at which no residue is generated (at which the residue is not deposited on the surface of the film) after etching is obtained at a temperature zone of about 250 degrees C. or higher.

Further, when a zirconium oxide film (ZrO film), which is an oxide film of high dielectric constant, is etched by using a boron trichloride gas ($BCl_3$ gas), B radicals and Cl radicals generated by decomposition of B—Cl are bonded to O and Zr of Zr—O, respectively, to generate gaseous $BO_x$ and $ZrCl_4$, such that the etching progresses. However, due to strong B—O bonds, Zr—O bonds may be broken and etched as $ZrCl_4$. That is, a precoating of about 100 nm may be needed before the etching process is performed because the B—O bonds may remain.

Therefore, the present discloser et al. paid attention to a level of atomic bonding energy (bond strength) during an etching reaction. In a reaction generation system, the higher the atomic bonding energy is, the easier generation of a substance having its covalent bond is. With respect to etching of the ZrO film, thermal etching by phosgene (hereinafter, referred to as a "$COCl_2$ gas"), which is a gas containing carbon (C), oxygen (O), and chlorine (Cl) is considered to simplify and examine an etching mechanism. A reaction when the ZrO film is etched with the $COCl_2$ gas is considered to progress as in a reaction formula (1) described below. Further, a pyrolysis reaction of the $COCl_2$ gas is considered to progress as a reaction formula (2) described below.

Atomic bonding energy levels of a reaction system and a generation system when etching the ZrO film by using the $COCl_2$ gas are indicated in Table 2 below.

TABLE 2

| Reaction system | | Generation system | | |
|---|---|---|---|---|
| | eV | | eV | Product |
| C—Cl | 4.13 | C—O | 11.21 | $CO_2$ |
| Zr—O | 8.02 | Zr—Cl | 5.52 | $ZrCl_4$ |
| C—O | 11.21 | Cl—Cl | 4.54 | $Cl_2$ |

As indicated in Table 2, the bonding energies of C—O and Zr—Cl are 11.21 eV and 5.52 eV, respectively. From Gibbs' free energy of chemical equilibrium and chemical reaction rate and Le Chatelier's principle, for example, a product generation level at a temperature of 600 degrees C. or lower and at a total pressure of 10 kPa or lower is considered to be indicated by a reaction formula (3) described below.

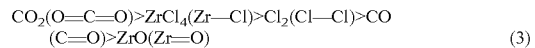

Figure 2:
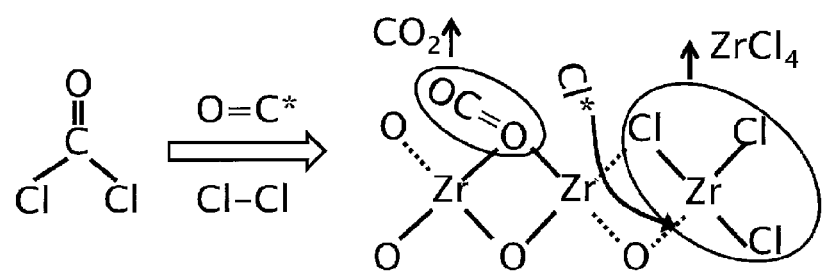
FIG. 2 is a diagram illustrating a reaction mechanism when a $COCl_2$ gas is supplied to a ZrO film.

That is, when the ZrO film is etched by using the $COCl_2$ gas, CO radicals and Cl radicals generated by decomposition of $COCl_2$ as indicated in the formula (2) are bonded to O and Zr of Zr—O, respectively, as indicated in the formula (1), to preferentially generate gaseous $CO_2$ and $ZrCl_4$, thereby allowing the etching reaction indicated in the formula (1) to progress in a positive direction. Further, the CO radicals are unstable and seek a strong bond with O to become stable $CO_2$. Therefore, since the CO radicals are bonded to O of Zr—O to be removed as $CO_2$, precoating may be omitted, thereby enabling efficient etching. FIG. 2 illustrates an atomic layer model of such reaction mechanism.

Embodiments of the Present Disclosure

Figure 3:
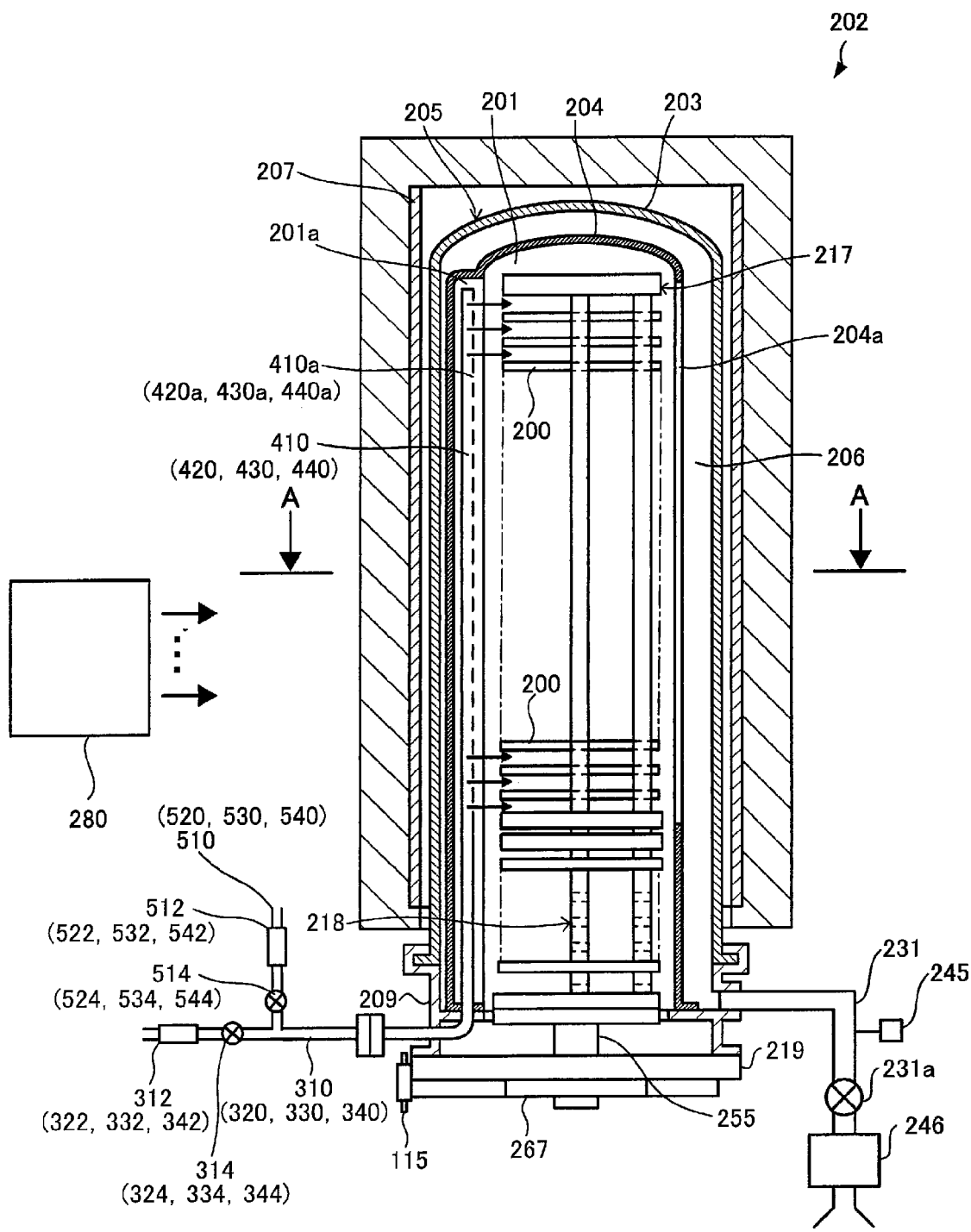
FIG. 3 is a schematic configuration diagram of a process furnace of a substrate processing apparatus suitably used in some embodiments of the present disclosure, in which a portion of the process furnace is shown in a vertical cross-sectional view.
Figure 4:
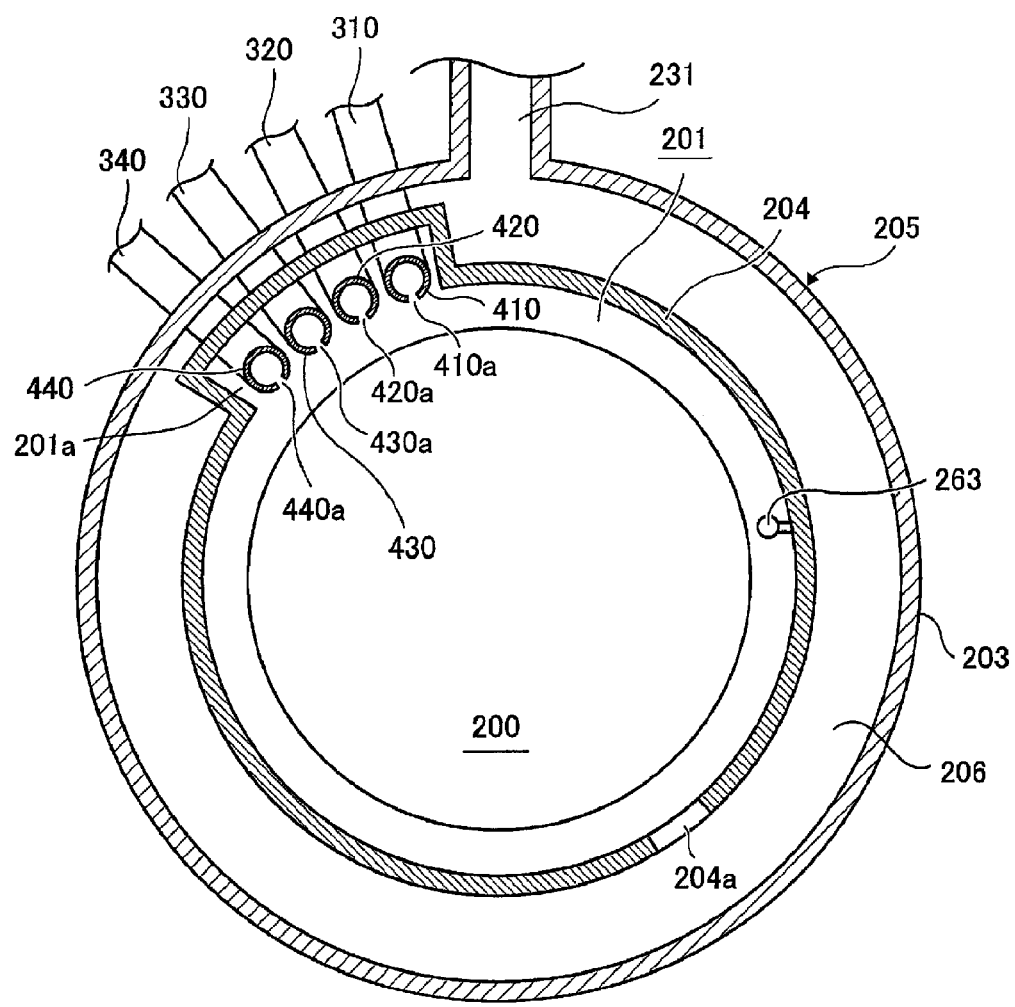
FIG. 4 is a schematic cross-sectional view taken along a line A-A in FIG. 3.

Some embodiments of the present disclosure will now be described with reference to FIGS. 3 to 5.

A substrate processing apparatus 10 is configured as an example of an apparatus used in a manufacturing process of a semiconductor device.

(1) Configuration of Substrate Processing Apparatus

The substrate processing apparatus 10 includes a process furnace 202 in which a heater 207 as a heating means (a heating mechanism or a heating system) is installed. The heater 207 has a cylindrical shape and is supported by a heater base (not shown) as a holding plate so as to be vertically installed.

An outer tube 203 constituting a reaction vessel (process vessel) is disposed inside the heater 207 to be concentric with the heater 207. The outer tube 203 is made of a heat resistant material, for example, quartz ($SiO_2$), silicon carbide (SiC) or the like, and has a cylindrical shape with its upper end closed and its lower end opened. A manifold (inlet flange) 209 is disposed below the outer tube 203 in a concentric relationship with the outer tube 203. The manifold 209 is made of metal, for example, stainless steel (SUS), and has a cylindrical shape with its upper and lower ends opened. An O-ring (not shown) as a seal member is installed between the upper end portion of the manifold 209 and the outer tube 203. The manifold 209 is supported by the heater base, whereby the outer tube 203 is placed vertically.

An inner tube 204 constituting a reaction vessel is disposed inside the outer tube 203. The inner tube 204 is made of a heat resistant material, for example, quartz, SiC or the like, and has a cylindrical shape with its upper end closed and its lower end opened. The process vessel (reaction vessel) mainly includes the outer tube 203, the inner tube 204, and the manifold 209. A process chamber 201 is formed in a hollow cylindrical portion of the process vessel (inside the inner tube 204).

The process chamber 201 is configured to be capable of accommodating wafers 200 as substrates, in such a state that the wafers 200 are arranged in a horizontal posture and in multiple stages along a vertical direction in a boat 217, which will be described below.

Nozzles 410, 420, 430 and 440 are installed in the process chamber 201 such that the nozzles penetrate a sidewall of the manifold 209 and the inner tube 204. Gas supply pipes 310, 320, 330 and 340 are respectively connected to the nozzles 410, 420, 430 and 440. However, the process furnace 202 of the embodiments is not limited to the aforementioned configuration. The number of nozzles and the like may be appropriately changed as needed.

Mass flow controllers (MFCs) 312, 322, 332 and 342, which are flow rate controllers (flow rate control parts), and valves 314, 324, 334 and 344, which are opening/closing valves, are installed at the gas supply pipes 310, 320, 330 and 340 sequentially from the corresponding upstream sides, respectively. Gas supply pipes 510, 520, 530 and 540 configured to supply an inert gas are respectively connected to the gas supply pipes 310, 320, 330 and 340 at the downstream side of the valves 314, 324, 334 and 344. MFCs 512, 522, 532 and 542 and valves 514, 524, 534, and 544 are respectively installed at the gas supply pipes 510, 520, 530 and 540 sequentially from the corresponding upstream sides.

The nozzles 410, 420, 430, and 440 are each configured as an L-shaped nozzle. Horizontal portions of the nozzles 410, 420, 430, and 440 are formed to penetrate the sidewall of the manifold 209 and the inner tube 204. Vertical portions of the nozzles 410, 420, 430, and 440 are each formed in a channel-shaped (groove-shaped) spare chamber 201a formed to protrude outward of the inner tube 204 in a radial direction and to extend along the vertical direction, and also formed to extend upward along the inner wall of the inner tube 204 in the spare chamber 201a (upward in the arrangement direction of the wafers 200).

The nozzles 410, 420, 430, and 440 are installed to extend from a lower region to an upper region of the process chamber 201, and a plurality of gas supply holes 410a, 420a, 430a and 440a are respectively formed at positions opposite to the wafers 200. Thus, a processing gas may be supplied from each of the gas supply holes 410a, 420a, 430a, and 440a of the nozzles 410, 420, 430, and 440 to the wafers 200. The gas supply holes 410a, 420a, 430a, and 440a may be installed in a plural number between the lower portion and the upper portion of the inner tube 204. The respective gas supply holes 410a, 420a, 430a, and 440a may have the same aperture area and may be formed at the same aperture pitch. However, the gas supply holes 410a, 420a, 430a, and 440a are not limited to the aforementioned configuration.

The gas supply holes 410a, 420a, 430a, and 440a may be formed in a plural number at height positions from the lower portion to the upper portion of the boat 217 as described below. Therefore, the processing gas supplied from the gas supply holes 410a, 420a, 430a, and 440a into the process chamber 201 (into the process vessel) is supplied to the wafers 200 accommodated from the lower portion to the upper portion of the boat 217, that is, to the whole region of the wafers 200 accommodated in the boat 217.

A metal-containing gas (metal-containing precursor), as the processing gas, is supplied from the gas supply pipe 310 into the process chamber 201 (into the process vessel) via the MFC 312, the valve 314, and the nozzle 410. As the metal-containing gas, it may be possible to use tetrakis (ethylmethylamino)zirconium $(Zr[N(CH_3)C_2H_5]_4$, abbreviation: TEMAZ), which is an organic precursor and contains, for example, zirconium (Zr). TEMAZ is used as a TEMAZ gas which is a liquid under a room temperature and an atmospheric pressure and which is used as a vaporized gas obtained by being vaporized with a vaporizer (not shown).

A first oxygen-containing gas (an oxygen-containing gas or an O-containing gas) as an oxidizing gas is supplied from the gas supply pipe 320 into the process chamber 201 (into the process vessel) via the MFC 322, the valve 324, and the nozzle 420. For example, ozone $(O_3)$ or the like is used as the first oxygen-containing gas.

An etching gas (cleaning gas) as the processing gas is supplied from the gas supply pipe 330 into the process chamber 201 (into the process vessel) via the MFC 332, the valve 334, and the nozzle 430. For example, a phosgene $(COCl_2$, carbonyl dichloride) gas which is halogenide and contains chlorine (Cl) or a chlorine-containing gas such as thionyl chloride $(SOCl_2)$ containing Cl is used as the etching gas.

A modifying gas as the processing gas is supplied from the gas supply pipe 340 into the process chamber 201 (into the process vessel) via the MFC 342, the valve 344, and the nozzle 440. For example, water vapor $(H_2O)$, which is a second oxygen-containing gas and is also a hydrogen-containing gas, is used as the modifying gas.

A metal-containing gas supply system mainly includes the gas supply pipe 310, the MFC 312, and the valve 314. A first oxygen-containing gas supply system mainly includes the gas supply pipe 320, the MFC 322, and the valve 324. The first oxygen-containing gas supply system will be referred to as an $O_3$ gas) supply system. A chlorine-based gas supply system mainly includes the gas supply pipe 330, the MFC 332, and the valve 334. The chlorine-based gas supply system will be referred to as a $COCl_2$ gas supply system. A modifying gas supply system mainly includes the gas supply pipe 340, the MFC 342, and the valve 344. The modifying gas supply system will be referred to as a second oxygen-containing gas supply system. The second oxygen-containing gas supply system will be referred to as a $H_2O$ gas supply system. In addition, an inert gas supply system mainly includes the gas supply pipes 510, 520, 530, and 540, the MFC 512, 522, 532, and 542, and the valves 514, 524, 534, and 544. The inert gas supply system may be referred to as a purge gas supply system, a dilution gas supply system, or a carrier gas supply system.

In a gas supply method according to the embodiments, a gas is transferred via the nozzles 410, 420, 430, and 440, which are disposed in the spare chamber 201a in an annular longitudinal space, that is, a cylindrical space, defined by the inner wall of the inner tube 204 and end portions of the wafers 200. Then, the gas is injected from the plurality of gas supply holes 410a, 420a, 430a, and 440a formed at positions of the nozzles 410, 420, 430, and 440 opposite to the wafers, into the inner tube 204.

An exhaust hole (exhaust port) 204a is a through-hole formed at the sidewall of the inner tube 204 and at the position opposite to the nozzles 410, 420, 430, and 440, that is, at the position opposite to the spare chamber 201a by 180 degree, and is, for example, a vertically-elongated slit-shaped through-hole. Therefore, the gas (the residual gas) supplied from the gas supply holes 410a, 420a, 430a, and 440a of the nozzles 410, 420, 430, and 440 into the process chamber 201 and flowing (that is, remaining) on the surfaces of the wafers 200 flows through an exhaust passage 206 as a gap formed between the inner tube 204 and the outer tube 203 via the exhaust hole 204a. Then, the gas flowing through the exhaust passage 206 flows through an exhaust pipe 231 and is discharged to the outside of the process furnace 202.

The exhaust hole 204a is formed at the position opposite to the wafers 200 (which may be the position opposite to the upper portion to the lower portion of the boat 217 in some embodiments), and the gas supplied from the gas supply holes 410a, 420a, 430a, and 440a to the vicinity of the wafers 200 in the process chamber 201 flows in the horizontal direction, that is, in a direction parallel to the surfaces of the wafers 200, and then flows through the exhaust passage 206 via the exhaust hole 204a. That is, the gas remaining within the process chamber 201 is exhausted in parallel to main surfaces of the wafers via the exhaust hole 204a. Further, the exhaust hole 204a is not limited to being configured as the slit-shaped through-hole but may be configured by a plurality of holes.

The exhaust pipe 231 configured to exhaust an internal atmosphere of the process chamber 201 is installed at the manifold 209. A pressure sensor 245 as a pressure detector (pressure detection part) which detects the internal pressure of the process chamber 201, an auto pressure controller (APC) valve 231a, and a vacuum pump 246 as a vacuum exhaust device are connected to the exhaust pipe 231 sequentially from the corresponding upstream side. The APC valve 231a is configured so that a vacuum exhaust and a vacuum exhaust stop of the interior of the process chamber 201 may be performed by opening and closing the APC valve 231a while operating the vacuum pump 246 and so that the internal pressure of the process chamber 201 can be regulated by adjusting an opening degree of the APC valve 231a while operating the vacuum pump 246. An exhaust system mainly includes the exhaust hole 204a, the exhaust passage 206, the exhaust pipe 231, the APC valve 231a, and the pressure sensor 245. The vacuum pump 246 may be included in the exhaust system.

A seal cap 219, which serves as a furnace opening lid configured to be capable of hermetically sealing a lower end opening of the manifold 209, is installed under the manifold 209. The seal cap 219 is configured to make contact with the lower end portion of the manifold 209 from the lower side in the vertical direction. For example, the seal cap 219 is made of a metal material such as stainless steel (SUS), and is formed in a disc shape. An O-ring (not shown), which is a seal member making contact with the lower end portion of the manifold 209, is installed at an upper surface of the seal cap 219. A rotation mechanism 267 configured to rotate the boat 217 which accommodates the wafers 200 is installed at the opposite side of the seal cap 219 from the process chamber 201. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up or down by a boat elevator 115 which is an elevator mechanism vertically installed outside the outer tube 203. The boat elevator 115 is configured as a transfer device (transfer mechanism) which transfers the boat 217 and the wafers 200 accommodated in the boat 217 into or out of the process chamber 201, by moving the seal cap 219 up or down.

The boat 217 serving as a substrate support is configured to support a plurality of wafers 200, for example, 25 to 200 wafers, in such a state that the wafers 200 are arranged in a horizontal posture and in multiple stages along a vertical direction with centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed at a lower portion of the boat 217 in a horizontal posture and in multiple stages (not shown).

A temperature sensor 263 serving as a temperature detector is installed at the inner tube 204. Based on temperature information detected by the temperature sensor 263, an amount of supplying electric power to the heater 207 is adjusted such that the interior of the process chamber 201 has a desired temperature distribution. Similar to the nozzles 410, 420, 430, and 440, the temperature sensor 263 is formed in an L shape. The temperature sensor 263 is installed along the inner wall of the inner tube 204.

Figure 5:
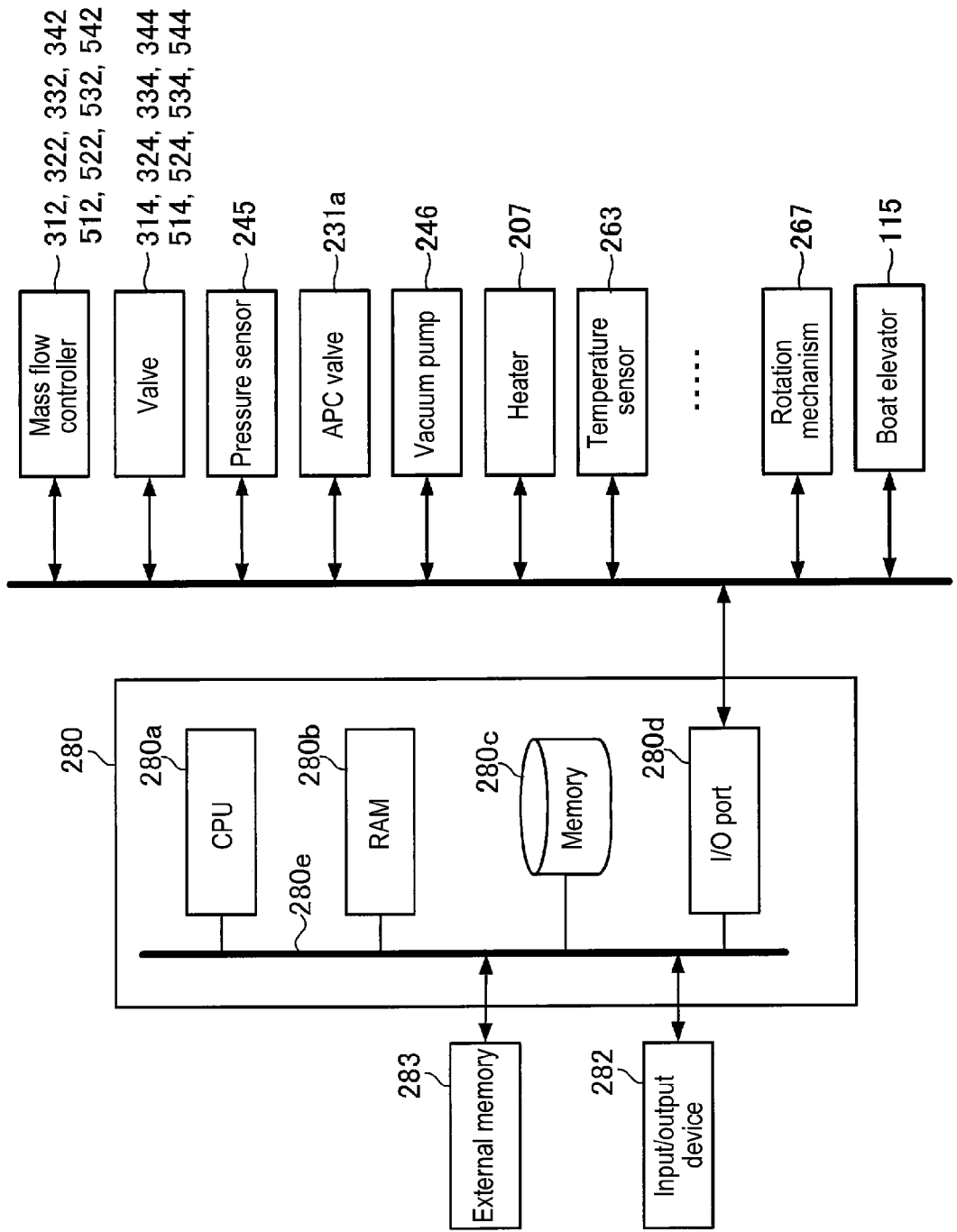
FIG. 5 is a block diagram illustrating a configuration of a controller of the substrate processing apparatus illustrated in FIG. 3.

As illustrated in FIG. 5, a controller 280, which is a control part (control means), may be configured as a computer including a central processing unit (CPU) 280a, a random access memory (RAM) 280b, a memory 280c, and an I/O port 280d. The RAM 280b, the memory 280c, and the I/O port 280d are configured to be capable of exchanging data with the CPU 280a via an internal bus 280e. An input/output device 282 formed of, for example, a touch panel or the like, is connected to the controller 280.

The memory 280c includes, for example, a flash memory, a hard disk drive (HDD), or the like. A control program that controls operations of a substrate processing apparatus, a process recipe in which sequences and conditions of a method of manufacturing a semiconductor device as described below are described, or the like is readably stored in the memory 280c. The process recipe functions as a program that causes the controller 280 to execute each process (each step) in the method of manufacturing a semiconductor device described below thus obtaining a predetermined result. Hereinafter, the process recipe and the control program will be generally and simply referred to as a "program." When the term "program" is used herein, it may indicate a case of including only the process recipe, a case of including only the control program, or a case of including combination of the process recipe and the control program. The RAM 280b is configured as a memory area (work area) in which a program, data or the like read by the CPU 280a is temporarily stored.

The I/O port 280d is connected to the aforementioned MFCs 312, 322, 332, 342, 512, 522, 532 and 542, the valves 314, 324, 334, 344, 514, 524, 534 and 544, the pressure sensor 245, the APC valve 231a, the vacuum pump 246, the heater 207, the temperature sensor 263, the rotation mechanism 267, the boat elevator 115, and the like.

The CPU 280a is configured to read the control program from the memory 280c and execute the same. The CPU 280a also reads the recipe or the like from the memory 280c according to an input of an operation command from the input/output device 282, or the like. In addition, the CPU 280a is configured to control, according to the contents of the recipe thus read, the flow rate adjusting operation of various kinds of gases by the MFCs 312, 322, 332, 342, 512, 522, 532, and 542, the opening/closing operation of the valves 314, 324, 334, 344, 514, 524, 534, and 544, the opening/closing operation of the APC valve 231a, the pressure regulating operation performed by the APC valve 231a based on the pressure sensor 245, the temperature adjusting operation performed by the heater 207 based on the temperature sensor 263, the driving and stopping of the vacuum pump 246, the operation of rotating the boat 217 and adjusting the rotation speed of the boat 217 by the rotation mechanism 267, the operation of moving the boat 217 up or down with the boat elevator 115, the operation of accommodating the wafers 200 in the boat 217, and the like.

The controller 280 may be configured by installing, on the computer, the aforementioned program stored in an external memory 283 (for example, a magnetic tape, a magnetic disc such as a flexible disc or a hard disk, an optical disc such as a CD or DVD, a magneto-optical disc such as a MO, or a semiconductor memory such as a USB memory or a memory card). The memory 280c or the external memory 283 is configured as a computer-readable recording medium. Hereinafter, the memory 280c and the external memory 283 will be generally and simply referred to as a "recording medium." In the present disclosure, the term "recording medium" may indicate a case of including only the memory 280c, a case of including only the external memory 283, or a case of including both the memory 280c and the external memory 283. Further, the program may be supplied to the computer by using a communication means such as the Internet or a dedicated line, instead of using the external memory 283.

(2) Substrate Processing

An example in which a film-forming process of forming a metal oxide film by supplying a metal-containing gas and a first oxygen-containing gas to a substrate is performed and then an etching process is performed, which is a process of manufacturing a semiconductor device, will be described. The film-forming process and the etching process are performed by using the process furnace 202 of the substrate processing apparatus 10 described above. In the following descriptions, operations of the respective parts constituting the substrate processing apparatus 10 are controlled by the controller 280.

When the term "wafer" is used herein, it may refer to "a wafer itself" or "a laminated body of a wafer and a predetermined layer or film formed on the surface of the wafer." In addition, when the phrase "a surface of a wafer" is used herein, it may refer to "a surface of a wafer itself" or "a surface of a predetermined layer or the like formed on a wafer." Further, when the term "substrate" is used herein, it may be synonymous with the term "wafer."

(Wafer Loading)

A plurality of wafers 200 is loaded into the process chamber 201 (boat loading). Specifically, when a plurality of wafers 200 are charged on the boat 217 (wafer charging), as illustrated in FIG. 3, the boat 217 supporting the plurality of wafers 200 is lifted up by the boat elevator 115 and is loaded into the process chamber 201. In this state, the seal cap 219 seals the lower end opening of the outer tube 203 via the O-ring.

(Pressure Regulation and Temperature Regulation)

The interior of the process chamber 201 is vacuum-exhausted by the vacuum pump 246 reach a desired pressure (degree of vacuum). In this operation, the internal pressure of the process chamber 201 is measured by the pressure sensor 245. The APC valve 231a is feedback-controlled based on the measured pressure information (pressure regulation). Further, the interior of the process chamber 201 is heated by the heater 207 to a desired temperature. In this operation, the amount of supplying electric power to the heater 207 is feedback-controlled based on the temperature information detected by the temperature sensor 263 such that the interior of the process chamber 201 has a desired temperature distribution (temperature adjustment).

Subsequently, the rotation of the boat 217 and the wafers 200 by the rotation mechanism 267 begins. The operation of the vacuum pump 246 and the heating and rotation of the wafers 200 may be continuously performed at least until the processing of the wafers 200 is completed.

[Film-Forming Process]

A step of forming a ZrO film which is an oxide film of high dielectric constant as a metal oxide film on a wafer 200 is performed.

(TEMAZ Gas Supply Step)

The valve 314 is opened to allow a TEMAZ gas to flow through the gas supply pipe 310. A flow rate of the TEMAZ gas is adjusted by the MFC 312. The TEMAZ gas is supplied from the gas supply hole 410a of the nozzle 410 into the process chamber 201 and is exhausted from the exhaust pipe 231. At this time, the TEMAZ gas is supplied to the wafer 200. Simultaneously, the valve 514 is opened to allow a $N_2$ gas to flow through the gas supply pipe 510. A flow rate of the $N_2$ gas flowing through the gas supply pipe 510 is adjusted by the MFC 512. The $N_2$ gas is supplied into the process chamber 201 together with the TEMAZ gas and is exhausted from the exhaust pipe 231. At this time, the valves 524, 534 and 544 are opened to allow the $N_2$ gas to flow through the gas supply pipes 520, 530 and 540 to prevent the TEMAZ gas from entering the nozzles 420, 430, and 440. The $N_2$ gas is supplied into the process chamber 201 via the gas supply pipes 320, 330, and 340 and the nozzles 420, 430 and 440 and is exhausted from the exhaust pipe 231.

At this time, the internal pressure of the process chamber 201 may be set at a pressure which falls within a range of, for example, 20 to 500 Pa, by adjusting the APC valve 231a. In the present disclosure, "20 to 500 Pa" may mean "20 Pa or more and 500 Pa or less." The same applies other numerical ranges and the like. The supply flow rate of the TEMAZ gas controlled by the MFC 312 may be set at a flow rate which falls within a range of, for example, 0.1 to 3.0 g/min. A time period, during which the wafer 200 is exposed to the TEMAZ gas, that is, a gas supply time (irradiation time), may be set to fall within a range of, for example, 10 to 300 seconds. The temperature of the heater 207 at this time is set such that the temperature of the wafer 200 falls within a range of, for example, 150 to 300 degrees C. A Zr-containing layer is formed on the wafer 200 by the supply of the TEMAZ gas. In the Zr-containing layer, an organic matter (carbon (C), hydrogen (H), nitrogen (N) or the like), derived from the TEMAZ gas, slightly remains as a residual element.

(Residual Gas Removal Step)

After the TEMAZ gas is supplied for a predetermined period of time, the valve 314 is closed to stop the supply of the TEMAZ gas. At this time, the interior of the process chamber 201 is vacuum-exhausted by the vacuum pump 246 while opening the APC valve 231a of the exhaust pipe 231. Thus, unreacted TEMAZ gas or TEMAZ gas having contributed to reduction, which remains within the process chamber 201, is removed from the interior of the process chamber 201. At this time, the supply of the $N_2$ gas into the process chamber 201 is maintained while opening the valves 524, 534, and 544. The $N_2$ gas acts as a purge gas. Thus, it is possible to enhance an effect of removing the unreacted TEMAZ gas or the TEMAZ gas having contributed to the reduction remaining within the process chamber 201 from the interior of the process chamber 201.

($O_3$ Gas Supply Step)

The valve 324 is opened to allow an $O_3$ gas) as the first oxygen-containing gas to flow through the gas supply pipe 320. A flow rate of the $O_3$ gas) is adjusted by the MFC 322. The $O_3$ gas) is supplied from the gas supply hole 420a of the nozzle 420 into the process chamber 201 and is exhausted from the exhaust pipe 231. At this time, the $O_3$ gas) is supplied to the wafer 200. Simultaneously, the valve 524 is opened to allow an inert gas such as a $N_2$ gas to flow through the gas supply pipe 520. The flow rate of the $N_2$ gas flowing through the gas supply pipe 520 is adjusted by the MFC 522. The $N_2$ gas is supplied into the process chamber 201 together with the $O_3$ gas) and is exhausted from the exhaust pipe 231. Further, at this time, the valves 514, 534 and 544 are opened to allow the $N_2$ gas to flow through the gas supply pipes 510, 530 and 540 to prevent the $O_3$ gas) from entering the nozzles 410, 430, and 440. The $N_2$ gas is supplied into the process chamber 201 via the gas supply pipes 310, 330, and 340 and the nozzles 410, 430, and 440 and is exhausted from the exhaust pipe 231.

When allowing the $O_3$ gas) to flow, the internal pressure of the process chamber 201 may be set at a pressure which falls within a range of, for example, 50 to 500 Pa, by appropriately adjusting the APC valve 231a. The supply flow rate of the $O_3$ gas) controlled by the MFC 322 may be set at a flow rate which falls within a range of, for example, 5 to 30 slm. The time period, during which the wafer 200 is exposed to the $O_3$ gas), that is, a gas supply time (irradiation time), may fall within a range of, for example, 10 to 300 seconds. The temperature of the heater 207 at this time may be the same as that of the TEMAZ gas supply step described above. The Zr-containing layer formed on the wafer 200 is oxidized by the supply of the $O_3$ gas) to form a ZrO layer. At this time, an organic matter (carbon (C), hydrogen (H), nitrogen (N) or the like), derived from the TEMAZ gas, slightly remains in the ZrO layer.

(Residual Gas Removal Step)

After the ZrO layer is formed, the valve 324 is closed to stop the supply of the $O_3$ gas). Then, the unreacted $O_3$ gas) or the $O_3$ gas) having contributed to the formation of the ZrO layer, which remains within the process chamber 201, is removed from the interior of the process chamber 201 according to the same processing procedures as those of the residual gas removal step before the $O_3$ gas) supply step.

(Performing a Predetermined Number of Times)

A cycle which sequentially performs the steps described above is performed one or more times (a predetermined number of times (n times)), whereby a ZrO film having a predetermined thickness can be formed on the wafer 200. The aforementioned cycle may be repeated multiple times. When forming the ZrO film in this way, the TEMAZ gas and the $O_3$ gas) are alternately (in a time-division fashion) supplied to the wafer 200 so as not to be mixed with each other.

(After-Purge and Returning to Atmospheric Pressure)

The $N_2$ gas is supplied from each of the gas supply pipes 510, 520, 530 and 540 into the process chamber 201 and is exhausted from the exhaust pipe 231. The $N_2$ gas acts as a purge gas. Thus, the interior of the process chamber 201 is purged with an inert gas, and a gas or a byproduct, which remains within the process chamber 201, is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (returning to atmospheric pressure).

(Wafer Unloading)

Subsequently, the seal cap 219 is moved down by the boat elevator 115 to open the lower end of the outer tube 203. Then, the processed wafers 200 supported on the boat 217 are unloaded from the lower end of the outer tube 203 to the outside of the outer tube 203 (boat unloading). Thereafter, the processed wafers 200 are discharged from the boat 217 (wafer discharging).

Figure 6:
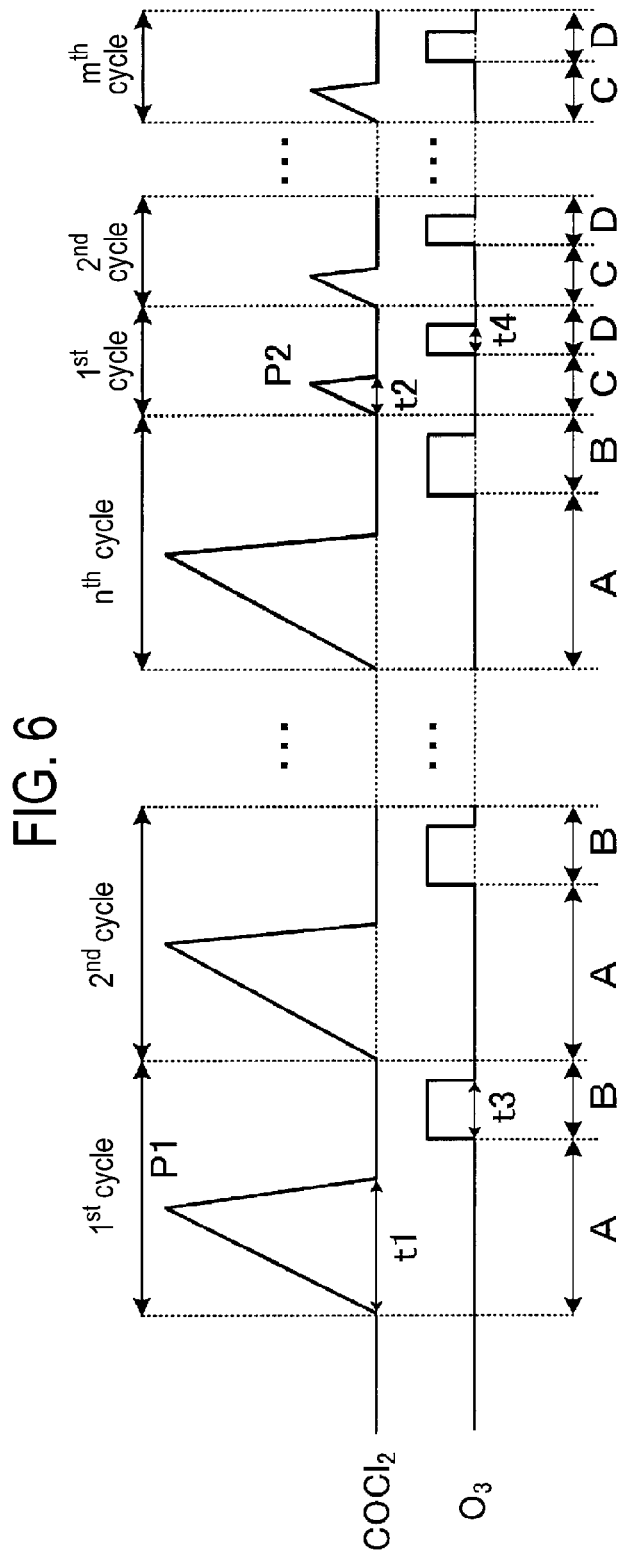
FIG. 6 is a diagram illustrating an example of a method of supplying a $COCl_2$ gas and an $O_3$ gas) in an etching process according to some embodiments of the present disclosure.

Subsequently, a process of etching the film adhering to the interior of the process chamber 201 (the interior of the process vessel) and the like will be described with reference to FIG. 6.

(Boat Loading)

The boat 217 with no wafer 200 charged is loaded into the process chamber 201 (boat loading). The boat 217 is lifted up by the boat elevator 115 and is loaded into the process chamber 201. In this state, the seal cap 219 seals the lower end opening of the outer tube 203 via the O-ring.

(Pressure Regulation and Temperature Regulation)

The interior of the process chamber 201 (the interior of the process vessel) is vacuum-exhausted by the vacuum pump 246 to reach a desired pressure (degree of vacuum). In this operation, the internal pressure of the process chamber 201 is measured by the pressure sensor 245. The APC valve 231a is feedback-controlled based on the measured pressure information (pressure regulation). Further, the interior of the process chamber 201 (the interior of the process vessel) is heated by the heater 207 to a desired temperature. In this operation, the amount of supplying electric power to the heater 207 is feedback-controlled based on the temperature information detected by the temperature sensor 263 such that the interior of the process chamber 201 has a desired temperature distribution (temperature adjustment). The operation of the vacuum pump 246 and the heating of the interior of the process chamber 201 by the heater 207 may be continuously performed at least until the etching process is completed.

[Etching (Cleaning) Process]

Steps A to D of etching the film adhering to the interior of the process chamber 201 (the interior of the process vessel) and the like to clean the interior of the process chamber 201 (the interior of the process vessel) are performed.

<Step A>

(High-Pressure Etching Step)

The valve 334 is opened to allow a $COCl_2$ gas to flow through the gas supply pipe 330. At this time, the internal pressure of the process chamber 201 (the process vessel) is raised to a first pressure P1 which is a predetermined pressure, by appropriately adjusting the APC valve 231a, to reach the first pressure P1, and then to allow the $COCl_2$ gas to flow while being quickly exhausted. A flow rate of the $COCl_2$ gas is adjusted by the MFC 332. The $COCl_2$ gas is supplied from the gas supply hole 430a of the nozzle 430 into the process chamber 201 and is exhausted from the exhaust pipe 231. At this time, the $COCl_2$ gas is supplied into the process chamber 201 (into the process vessel) under the first pressure. Simultaneously, the valve 534 is opened to allow an inert gas such as a $N_2$ gas to flow through the gas supply pipe 530. The flow rate of the $N_2$ gas flowing through the gas supply pipe 530 is adjusted by the MFC 532. The $N_2$ gas is supplied into the process chamber 201 together with the $COCl_2$ gas and is exhausted from the exhaust pipe 231. Further, at this time, the valves 514, 524, and 544 are opened to allow the $N_2$ gas to flow through the gas supply pipes 510, 520, and 540 to prevent the $COCl_2$ gas from entering the nozzles 410, 420, and 440. The $N_2$ gas is supplied into the process chamber 201 via the gas supply pipes 310, 320, and 340 and the nozzles 410, 420, and 440 and is exhausted from the exhaust pipe 231.

At least a portion of the ZrO film adhering to the interior of the process chamber 201 (the process vessel) reacts with the $COCl_2$ gas by the supply of the $COCl_2$ gas, to be removed from the process chamber 201. Specifically, Zr—O bonds by four Os bonded to the Zr atom need be broken to remove the ZrO film, but it is considered that two bonds on the outermost surface are terminated with Zr—H or Zr—OH. A reaction may be considered in which, by supplying the $COCl_2$ gas to the process chamber 201, Cl radicals derived from the $COCl_2$ gas are adsorbed on Zr—H of the ZrO surface to be desorbed as HCl, and Cl radicals or CO radicals derived from the $COCl_2$ gas are adsorbed on Zr—OH of the ZrO surface to be desorbed as HCl or $CO_x$. Thereafter, the Cl radicals and CO radicals generated by continuous decomposition of the $COCl_2$ gas are respectively bonded to Zr and O of the ZrO surface to produce $ZrCl_x$, $CO_x$, $Cl_2$ or the like, which are removed from the process chamber 201 for etching. That is, the Zr—O bonds are broken by the CO radicals and Cl radicals generated by pyrolysis of the $COCl_2$ gas to produce Zr—Cl bonds and $CO_x$. Further, the Zr—O bonds where the Cl radicals remain are broken to produce $CO_2$ and $ZrCl_4$. In the reaction between the ZrO film and the $COCl_2$ gas, it is considered that a reaction delay time exists.

In this case, there are two types of $CO_x$ in a stable state, in which $CO_2$ stably exists at 700 degrees C. or lower and CO stably exists at 900 degrees C. or higher. In the embodiments, the heater 207 is controlled by the controller 280 to heat the interior of the process chamber 201 to a predetermined temperature of 700 degrees C. or lower which falls within a range of, for example, 250 to 700 degrees C., specifically 550 to 650 degrees C., whereby the $COCl_2$ gas is activated to generate $CO_2$ to be removed in some embodiments. In addition, a plasma generator may be installed inside or outside the process chamber 201 to plasma-process the $COCl_2$ gas to generate Cl radicals in the process chamber 201 or to supply the Cl radicals to the process chamber 201. At this time, the APC valve 231a is closed or substantially closed so that the process may not be affected, whereby the $COCl_2$ gas is confined in the process chamber 201. By confining the $COCl_2$ gas, it is possible to reduce an influence of the aforementioned reaction delay on the etching. Further, the first pressure P1 described above may be set at a pressure which falls within a range of, for example, 1,330 to 13,300 Pa, specifically 6,500 to 13,300 Pa in some embodiments, or more specifically 10,000 to 13,300 Pa in some embodiments. The supply flow rate of the $COCl_2$ gas controlled by the MFC 332 may be set at a flow rate which falls within a range of, for example, 1.0 to 5.0 slm, specifically 3.5 to 4.5 slm in some embodiments. A time period t1 ($COCl_2$ gas supply time), during which the $COCl_2$ gas is supplied to the process chamber 201, may be set to fall within a range of, for example, 200 to 600 seconds. In addition, the exhaust flow rate of the interior of the process chamber 201 (the interior of the process vessel) of the high-pressure etching step may be reduced by reducing the opening degree of the APC valve 231a during the supply of the $COCl_2$ gas. Further, the exhaust of the interior of the process chamber 201 (the interior of the process vessel) of the high-pressure etching step may be stopped by fully closing the APC valve 231a during the supply of the $COCl_2$ gas. By doing so, it is possible to quickly raise the internal pressure of the process chamber 201, and to achieve the same effects as those when increasing the flow rate of the gas or when lengthening the supply time. Further, it is possible to reduce residues on the upper portion of the process chamber 201.

(Residual Gas Removal Step)

After the $COCl_2$ gas is supplied to the process chamber 201 (into the process vessel) for a predetermined period of time, the valve 334 is closed to stop the supply of the $COCl_2$ gas. In a case where the APC valve 231a is closed or substantially closed so as not to affect the process, the APC valve 231a is opened. Then, the unreacted $COCl_2$ gas or the $COCl_2$ gas having contributed to the removal of the ZrO layer, which remains within the process chamber 201, is removed from the interior of the process chamber 201 according to the same processing procedures as those of the residual gas removal step of the TEMAZ gas supply step.

<Step B>

(Surface Oxidation Step)

The valve 324 is opened to allow an $O_3$ gas) to flow through the gas supply pipe 320. A flow rate of the $O_3$ gas) is adjusted by the MFC 322. The $O_3$ gas) is supplied from the gas supply hole 420a of the nozzle 420 into the process chamber 201 and is exhausted from the exhaust pipe 231. At this time, the $O_3$ gas) is supplied into the process chamber 201 (into the process vessel). Simultaneously, the valve 524 is opened to allow an inert gas such as a $N_2$ gas to flow through the gas supply pipe 520. A flow rate of the $N_2$ gas flowing through the gas supply pipe 520 is adjusted by the MFC 522. The $N_2$ gas is supplied into the process chamber 201 together with the $O_3$ gas) and is exhausted from the exhaust pipe 231. Further, at this time, the valves 514, 534, and 544 are opened to allow the $N_2$ gas to flow through the gas supply pipes 510, 530, and 540 to prevent the $O_3$ gas from entering the nozzles 410, 430, and 440. The $N_2$ gas is supplied into the process chamber 201 via the gas supply pipes 310, 330, and 340 and the nozzles 410, 430, and 440 and is exhausted from the exhaust pipe 231.

When allowing the $O_3$ gas) to flow, the internal pressure of the process chamber 201 (the process vessel) may be set to fall within a range of, for example, 500 to 1,000 Pa, by appropriately adjusting the APC valve 231a. The supply flow rate of the $O_3$ gas) controlled by the MFC 322 may be set to fall within a range of, for example, 10 to 50 slm. The supply time, during which the $O_3$ gas) is supplied to the process chamber 201, may be set to be a first time t3 as a predetermined time, which falls within a range of, for example, 60 to 300 seconds. The temperature of the heater 207 at this time may be similar to that of the high-pressure etching step described above.

The inner wall of the process chamber 201 or the surface of the boat 217 or the like is oxidized (treated) by the supply of the $O_3$ gas). Further, the byproduct generated at the high-pressure etching step is re-oxidized.

(Residual Gas Removal Step)

After the $O_3$ gas is supplied for a predetermined period of time, the valve 324 is closed to stop the supply of the $O_3$ gas). Then, the unreacted $O_3$ gas) or the $O_3$ gas) having reacted with the ZrO film, which remains within the process chamber 201, is removed from the interior of the process chamber 201 (the interior of the process vessel) according to the same processing procedures as those of the residual gas removal step of the TEMAZ gas supply step.

(Performing a Predetermined Number of Times)

A cycle which sequentially performs steps A and B described above is performed one or more times (a predetermined number of times (n times)). The aforementioned cycle may be repeated multiple times in some embodiments.

<Step C>

(Low-Pressure Etching Step)

The valve 334 is opened to allow a $COCl_2$ gas to flow through the gas supply pipe 330. At this time, the internal pressure of the process chamber 201 (the process vessel) is lowered to a second pressure P2 lower than the first pressure at step A described above by appropriately adjusting the APC valve 231a, to reach the second pressure P2, and then to allow the $COCl_2$ gas to flow while being quickly exhausted. A flow rate of the $COCl_2$ gas is adjusted by the MFC 332. The $COCl_2$ gas is supplied from the gas supply hole 430a of the nozzle 430 into the process chamber 201 and is exhausted from the exhaust pipe 231. That is, the $COCl_2$ gas is supplied into the process chamber 201 (into the process vessel) under a pressure lower than that of the high-pressure etching step. Simultaneously, the valve 534 is opened to allow an inert gas such as a $N_2$ gas to flow through the gas supply pipe 530. A flow rate of the $N_2$ gas flowing through the gas supply pipe 530 is adjusted by the MFC 532. The $N_2$ gas is supplied into the process chamber 201 together with the $COCl_2$ gas and is exhausted from the exhaust pipe 231. Further, at this time, the valves 514, 524 and 544 are opened to allow the $N_2$ gas to flow through the gas supply pipes 510, 520, and 540 to prevent the $COCl_2$ gas from entering the nozzles 410, 420, and 440. The $N_2$ gas is supplied into the process chamber 201 via the gas supply pipes 310, 320, and 340 and the nozzles 410, 420, and 440 and is exhausted from the exhaust pipe 231. The ZrO film adhering to the interior of the process chamber 201 (the inner wall of the process chamber 201, the boat 217, and the like) and not removed at the high-pressure etching step reacts with the supplied $COCl_2$ gas to generate $ZrCl_4$, $CO_2$ or the like, which is removed from the process chamber 201. Further, Cl (residual chlorine) remaining within the ZrO film reacts with the $COCl_2$ gas supplied at the high-pressure etching step, whereby Cl is removed from the process chamber 201.

At this time, the heater 207 is controlled by the controller 280 to heat the interior of the process chamber 201 to the same temperature as that of the high-pressure etching step to activate the $COCl_2$ gas to generate $CO_2$, which is removed. Alternatively, similar to the high-pressure etching step, a plasma generator may be installed inside or outside the process chamber 201 to plasma-process the $COCl_2$ gas to generate Cl radicals in the process chamber 201 or to supply the Cl radicals to the process chamber 201. At this time, the APC valve 231a is closed or substantially closed so that the process may not affected, whereby the $COCl_2$ gas is confined in the process chamber 201. Further, the second pressure P2 described above may be set to fall within a range of, for example, 1 to 10,000 Pa, specifically 8,000 to 10,000 Pa in some embodiments. The supply flow rate of the $COCl_2$ gas controlled by the MFC 332 may be set to fall within a range of, for example, 1.0 to 5.0 slm, specifically 3.5 to 4.5 slm in some embodiments. A time period t2 ($COCl_2$ gas supply time), during which the $COCl_2$ gas is supplied to the process chamber 201, may be set to fall within a range of, for example, 60 to 180 seconds. Further, the exhaust flow rate of the interior of the process chamber 201 of the low-pressure etching step may be reduced by reducing the opening degree of the APC valve 231a during the supply of the $COCl_2$ gas. Further, the exhaust of the interior of the process chamber 201 of the high-pressure etching step may be stopped by fully closing the APC valve 231a during the supply of the $COCl_2$ gas. By doing so, it is possible to quickly raise the internal pressure of the process chamber 201 and to achieve the same effects as those when increasing the flow rate of the gas and when lengthening the supply time. Further, it is possible to reduce the residues on the upper portion of the process chamber 201.

(Residual Gas Removal Step)

After the $COCl_2$ gas is supplied to the process chamber 201 for a predetermined period of time, the valve 334 is closed to stop the supply of the $COCl_2$ gas. When the APC valve 231a is closed or substantially closed so that the process is not affected, the APC valve 231a is opened. Then, the unreacted $COCl_2$ gas or the $COCl_2$ gas having contributed to the removal of the ZrO layer or Cl, which remains within the process chamber 201, is removed from the interior of the process chamber 201 (the interior of the process vessel) according to the same processing procedures as those of the residual gas removal step of the TEMAZ gas supply step.

<Step D>
(Surface Oxidation Step)

The valve 324 is opened to allow an $O_3$ gas) to flow through the gas supply pipe 320. A flow rate of the $O_3$ gas) is adjusted by the MFC 322. The $O_3$ gas) is supplied from the gas supply hole 420a of the nozzle 420 into the process chamber 201 and is exhausted from the exhaust pipe 231. At this time, the $O_3$ gas) is supplied into the process chamber 201 (into the process vessel). Simultaneously, the valve 524 is opened to allow an inert gas such as a $N_2$ gas to flow through the gas supply pipe 520. A flow rate of the $N_2$ gas flowing through the gas supply pipe 520 is adjusted by the MFC 522. The $N_2$ gas is supplied into the process chamber 201 together with the $O_3$ gas) and is exhausted from the exhaust pipe 231. Further, at this time, the valves 514, 534, and 544 are opened to allow the $N_2$ gas to flow through the gas supply pipes 510, 530, and 540 to prevent the $O_3$ gas) from entering the nozzles 410, 430, and 440. The $N_2$ gas is supplied into the process chamber 201 via the gas supply pipes 310, 330, and 340 and the nozzles 410, 430, and 440 and is exhausted from the exhaust pipe 231.

When allowing the $O_3$ gas) to flow, the internal pressure of the process chamber 201 (the process vessel) may be set to fall within a range of, for example, 500 to 1,000 Pa, by appropriately adjusting the APC valve 231a. The supply flow rate of the $O_3$ gas) controlled by the MFC 322 may be set to fall within a range of, for example, 10 to 50 slm. The supply time, during which the $O_3$ gas) is supplied to the process chamber 201, may be set to be a second time t4 shorter than the first time t3 at step B and fall within a range of, for example, 30 to 150 seconds. The temperature of the heater 207 at this time may be similar to that of the low-pressure etching step described above.

The inner wall of the process chamber 201 (the inner wall of the process vessel) or the surface of the boat 217 or the like is oxidized (treated) by the supply of the $O_3$ gas). Further, the byproduct generated at the low-pressure etching step is re-oxidized.

(Residual Gas Removal Step)

After the $O_3$ gas is supplied for a predetermined period of time, the valve 324 is closed to stop the supply of the $O_3$ gas). Then, the unreacted $O_3$ gas) or the $O_3$ gas) having reacted with the ZrO film, which remains within the process chamber 201, is removed from the interior of the process chamber 201 (the interior of the process vessel) according to the same processing procedures as those of the residual gas removal step of the TEMAZ gas supply step.

(Performing a Predetermined Number of Times)

A cycle which sequentially performs steps C and D described above is performed one or more times (a predetermined number of times (m times)). The aforementioned cycle may be repeated multiple times.

That is, the ZrO film adhering to the inner wall of the process chamber 201 (the inner wall of the process vessel), the boat 217 and the like may be removed by performing the cycle which sequentially performs steps C and D one or more times (a predetermined number of times (m times)) after performing the cycle which sequentially performs steps A and B described above one or more times (a predetermined number of times (n times)).

Subsequently, a post-processing is performed to reduce the residual chlorine.

(Post-Processing Step)

From an etching principle and a Zr chloride vapor pressure curve of product, chlorine may remain within the process chamber 201 (within the process vessel) after etching. The residual chlorine may affect a subsequent film-forming process. Therefore, $H_2O$ is introduced into the process chamber 201 to remove the residual chlorine. The valve 344 is opened to allow $H_2O$ to flow through the gas supply pipe 340. A flow rate of $H_2O$ is adjusted by the MFC 342. $H_2O$ is supplied from the gas supply hole 440a of the nozzle 440 into the process chamber 201 and is exhausted from the exhaust pipe 231. At this time, $H_2O$ is supplied into the process chamber 201 (the process vessel). Simultaneously, the valve 544 is opened to allow an inert gas such as a $N_2$ gas to flow through the gas supply pipe 540. A flow rate of the $N_2$ gas flowing through the gas supply pipe 540 is adjusted by the MFC 542. The $N_2$ gas is supplied into the process chamber 201 together with $H_2O$ and is exhausted from the exhaust pipe 231. Further, at this time, the valves 514, 524, and 534 are opened to allow the $N_2$ gas to flow through the gas supply pipes 510, 520, and 530 to prevent $H_2O$ from entering the nozzles 410, 420, and 430. The $N_2$ gas is supplied into the process chamber 201 via the gas supply pipes 310, 320, and 330 and the nozzles 410, 420, and 430 and is exhausted from the exhaust pipe 231. The chlorine remaining within the process chamber 201 is removed by the supply of $H_2O$.

(Residual Gas Removal Step)

After a lapse of a predetermined period of time, the valve 344 is closed to stop the supply of $H_2O$. Then, $H_2O$, which remains within the process chamber 201, is removed from the interior of the process chamber 201 according to the same processing procedures as those of the residual gas removal step after the TEMAZ gas supply step described above.

(After-Purge and Returning to Atmospheric Pressure)

The $N_2$ gas is supplied from each of the gas supply pipes 510, 520, 530, and 540 into the process chamber 201 and is exhausted from the exhaust pipe 231. The $N_2$ gas acts as a purge gas. Thus, the interior of the process chamber 201 is purged with an inert gas, and a gas or a byproduct, which remains within the process chamber 201, is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (returning to atmospheric pressure).

After cleaning the interior of the process chamber 201 (the interior of the process vessel) (etching the ZrO film adhering to the interior) in this way, the film-forming process is performed. After the film-forming process is performed a predetermined number of times, the etching process as maintenance is performed again.

FIGS. 7A to 7D are diagrams illustrating a mechanism of a surface oxidation process in the etching process.

Figure 7A:
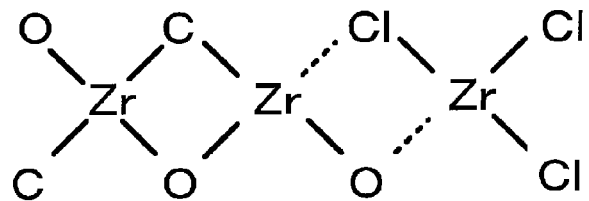
FIGS. 7A to 7D are diagrams illustrating a mechanism of a surface oxidation process in the etching process.
Figure 7B:
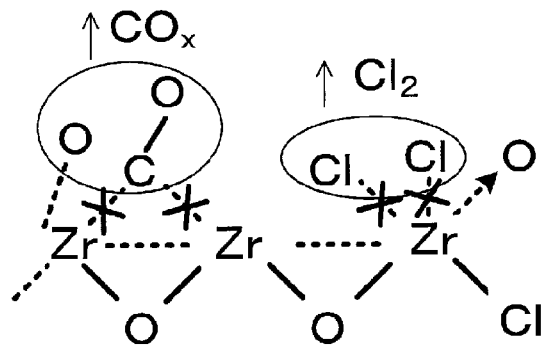
Figure 7C:
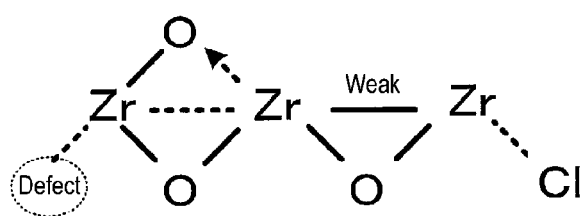
Figure 7D:
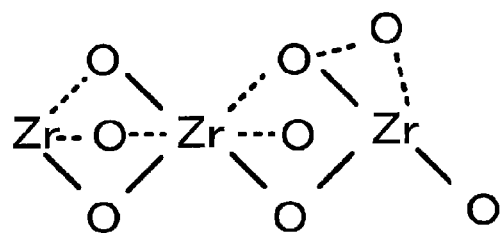

As illustrated in FIGS. 7A and 7B, the Zr—Cl bonds of $ZrCl_x$ generated by the supply of the $COCl_2$ gas are broken by the supply of the $O_3$ gas) to be removed as $Cl_2$ and re-oxidized into ZrO. Further, an organic matter remaining within the ZrO film reacts with the $O_3$ gas) to be removed from the process chamber 201. For example, carbon (C) remaining within the ZrO film reacts with the $O_3$ gas) to become $CO_x$, which is removed from the process chamber 201. At this time, on the outermost surface of the film, carbon defects after desorption of $CO_x$ exist and a weak bond equilibrium state of Zr—O and Zr—Zr exists, as illustrated in FIG. 7C. This state may be a surface equilibrium state suitable for etching. Further, in a case where the supply time of the $O_3$ gas) is too long due to the state of the surface oxidation process, peroxidation occurs, as illustrated in FIG. 7D.

That is, there is an optimization condition of the surface oxidization process, such that oxidation (re-oxidation of byproduct) is performed to suppress adhesion of the byproduct when the surface oxidation process is performed.

Figure 8A:
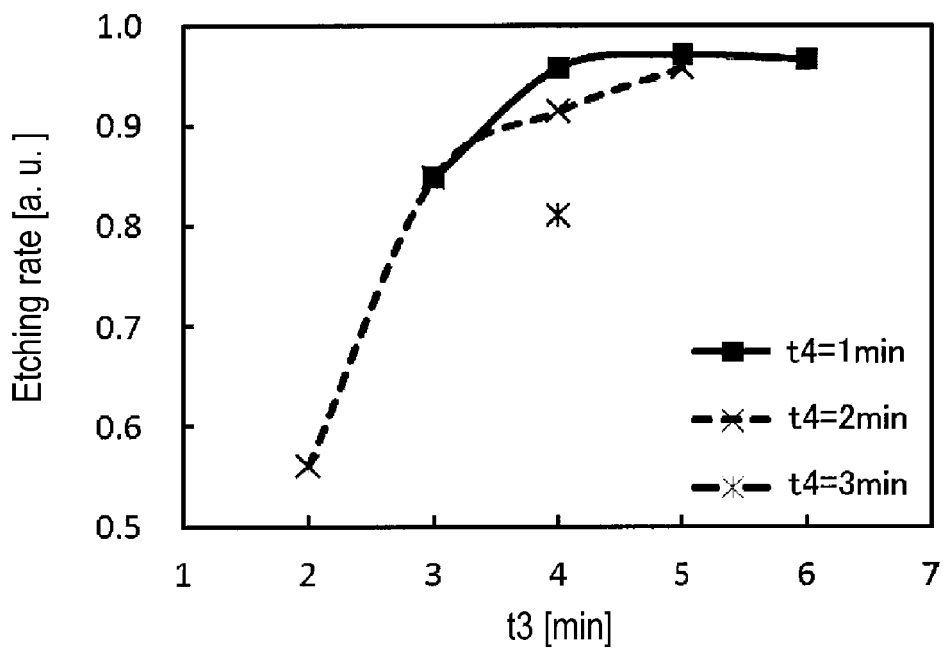
FIG. 8A is a diagram schematically illustrating a relationship between an $O_3$ gas) supply time and an etching rate in the etching process.

FIG. 8A is a diagram schematically illustrating a relationship between a surface oxidation process time ($O_3$ gas) supply time) and an etching rate in the etching process described above.

As illustrated in FIG. 8A, an optimum time of an $O_3$ gas) supply time t3 at step B may be about 5 minutes. Further, as illustrated in FIG. 8A, when an $O_3$ gas) supply time t4 at step D is 1 minute, 2 minutes, and 3 minutes, an optimum time of the $O_3$ gas) supply time t4 at step D may be about 1 minute. That is, the oxidation process is performed to suppress the adhesion of the byproduct by setting the supply time of the $O_3$ gas) to the process chamber 201 (process vessel) at step D shorter than the supply time of the $O_3$ gas) to the process chamber 201 (process vessel) at step B. Further, when the $O_3$ gas) supply time t4 at step D is longer than 1 minute, peroxidation may occur, thus lowering the etching rate. Further, it is known that the byproduct is dramatically reduced when the $O_3$ gas) supply time t3 at step B becomes 8 minutes or more.

In addition, for example, when the $O_3$ gas) supply time t3 at step B and the $O_3$ gas) supply time t4 at step D are respectively set to 4 minutes and 1 minute, it is confirmed that the etching time is reduced by about 29% as compared with a case where they are respectively set to 5 minutes.

Figure 8B:
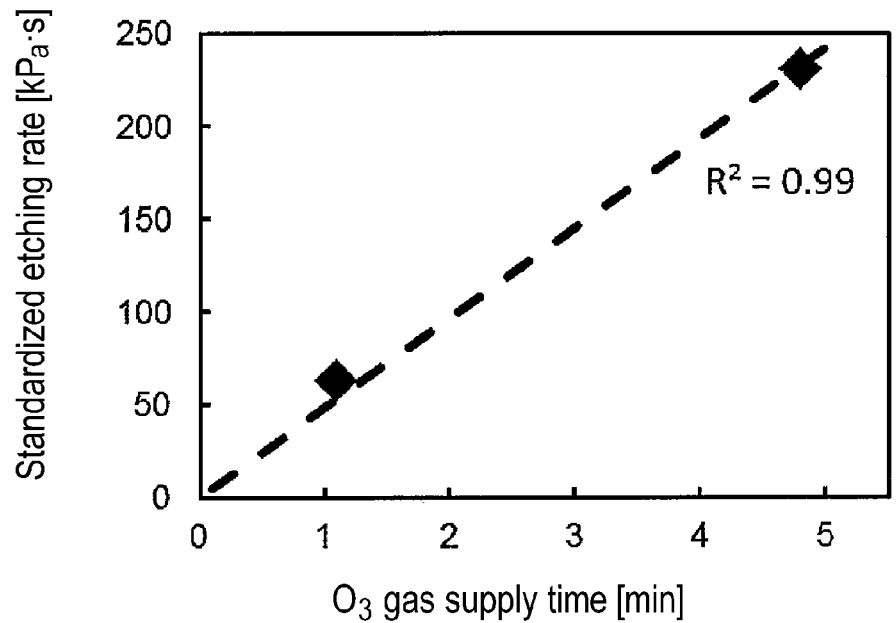
FIG. 8B is a diagram schematically illustrating a relationship between an $O_3$ gas) supply time and a standardized etching rate in the etching process.

FIG. 8B is a diagram schematically illustrating a relationship between a surface oxidation process time ($O_3$ gas) supply time) and a standardized etching rate in the etching process. As illustrated in FIG. 8B, the surface oxidation process time and the standardized etching rate are in a linear relationship, and the optimization conditions of the surface oxidation process are determined according to etching conditions such as a type, a pressure, a flow rate or the like of the etching gas.

That is, by setting the supply amount (exposure amount) of the $O_3$ gas) to the process chamber 201 (process vessel) at step B described above different from the supply amount of the $O_3$ gas) to the process chamber 201 (process vessel) at step D described above, it is possible to efficiently remove a film such as an oxide film of high dielectric constant while shortening the etching time. Further, the supply amount of the $O_3$ gas) may be expressed by concentration of the $O_3$ gas)×supply time of the $O_3$ gas. That is, at steps B and D, the surface oxidation process is optimized by varying the supply amount of the $O_3$ gas) by adjusting either one or both of the concentration or the supply time as the supply amount (concentration×supply time) of the $O_3$ gas in one cycle (step). At steps B and D described above, the supply time of the $O_3$ gas) is adjusted, but the surface oxidation process may be optimized by adjusting the concentration of the $O_3$ gas), or both of the concentration and the supply time of the $O_3$ gas). Further, any one of a flow rate, a time, or a product of the flow rate and the time may be used as the supply amount.

As described above, one or more effects as set forth below may be achieved by performing the etching process.

(a) By performing the high-pressure etching step, it is possible to remove the ZrO film adhering to the inner wall of the process chamber 201 (the inner wall of the process vessel), the boat 217, and the like at a faster etching rate (speed).

(b) By performing the low-pressure etching step, it is possible to remove components derived from the etching gas remaining as the byproduct in the ZrO film still remaining after the high-pressure etching step.

(c) By performing etching by varying the pressure by combination of the high-pressure etching step and the low-pressure etching step, it is possible to obtain etching characteristics at each pressure zone, thereby performing the etching more efficiently.

(d) By performing the surface oxidation step between the high-pressure etching step and the low-pressure etching step, it is possible to remove the organic matter remaining within the ZrO film by reaction with the organic matter, thereby preventing contamination by the organic matter in the process chamber 201 (in the process vessel).

(e) By performing the surface oxidation step between the high-pressure etching step and the low-pressure etching step, it is possible to remove the organic matter remaining within the ZrO film by reaction with the organic matter, thereby producing carbon defects.

(f) By performing the surface oxidation step between the high-pressure etching step and the low-pressure etching step, the byproduct generated at the high-pressure etching step may be re-oxidized and removed at the low-pressure etching step.

(g) By performing the surface oxidation step of step B after the high-pressure etching step and performing the surface oxidation step of step D whose processing time is shorter than that of step B after the low-pressure etching step, it is possible to prevent the peroxidation and to optimize the surface treatment.

(h) By sequentially performing the high-pressure etching step, the surface oxidation step, the low-pressure etching step and the surface oxidation step, it is possible to achieve one or more effects among the aforementioned effects (a) to (g).

(i) By repeating the high-pressure etching step, the surface oxidation step, the low-pressure etching step, and the surface oxidation step a plurality of times, it is possible to etch (remove) the ZrO film adhering to the interior of the process chamber 201 (the interior of the process vessel) with high controllability such that the process chamber 201 can be cleaned.

(j) By confining the $COCl_2$ gas at the high-pressure etching step and the low-pressure etching step, it is possible to reduce an influence of the reaction delay between the ZrO film and the $COCl_2$ gas on the etching.

(k) By performing cyclic etching of high-pressure (first pressure) and low-pressure (second pressure), it is possible to increase the etching rate at the high pressure and to volatilize the byproduct at the low pressure. By performing the etching in two stages and cyclically repeating the etching in this way, it is possible to enhance an etching efficiency.

Other Embodiments

While the embodiments of the present disclosure have been specifically described above, the present disclosure is not limited to the aforementioned embodiments but may be variously modified without departing from the spirit of the present disclosure.

Figure 9:
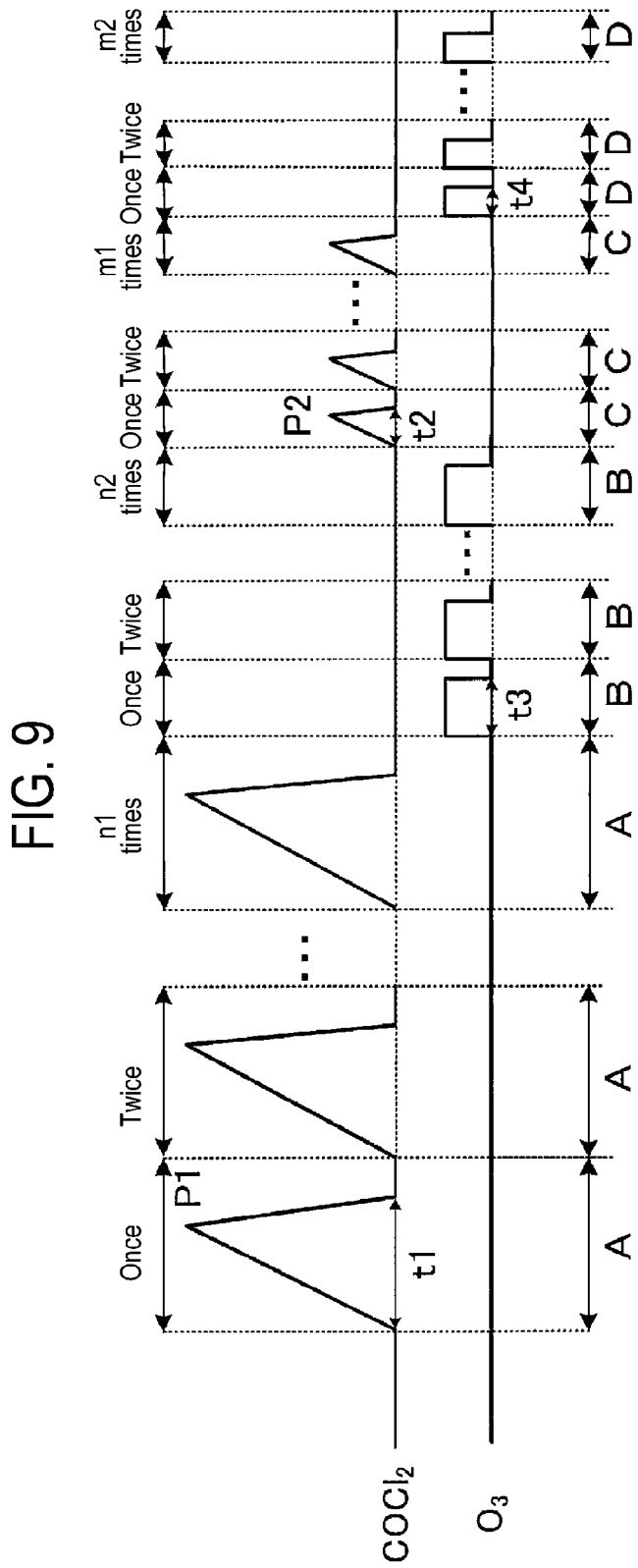
FIG. 9 is a diagram schematically illustrating an exemplary modification of the method of supplying a $COCl_2$ gas and an $O_3$ gas) in the etching process according to some embodiments of the present disclosure.

For example, as illustrated in FIG. 9, the ZrO film adhering to the interior of the process chamber 201 may be removed by sequentially performing step A, step B, step C, and step D one or more times in the etching process described above.

Figure 10A:
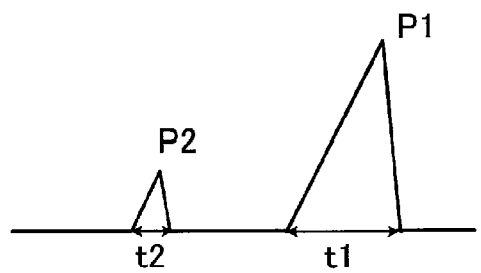
FIGS. 10A to 10D are diagrams schematically illustrating an exemplary modification of a method of supplying a $COCl_2$ gas.
Figure 10B:
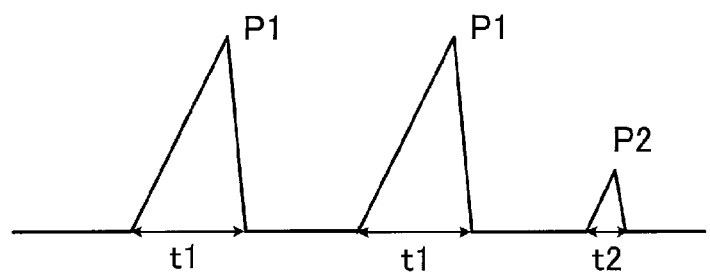
Figure 10C:
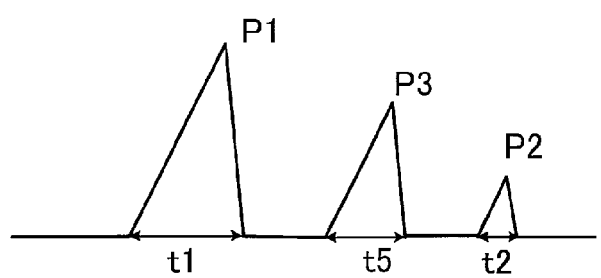
Figure 10D:
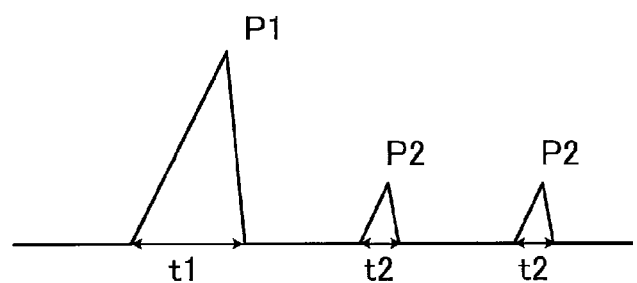

Further, in the aforementioned etching process, the high-pressure etching step (step A) may be performed after the low-pressure etching step (step C), as illustrated in FIG. 10A. Further, as illustrated in FIG. 10B, the low-pressure etching step (step C) may be performed after performing the high-pressure etching step (step A) two or more times. Thus, it is possible to improve an etching rate per unit time at the same etching cycle. Further, as illustrated in FIG. 10C, an intermediate pressure etching step of raising the pressure to reach an intermediate pressure P3 of a maximum pressure of the high-pressure etching step and a maximum pressure of the low-pressure etching step, and then allowing the etching gas to flow while being quickly exhausted may be performed one or more times between the high-pressure etching step (step A) and the low-pressure etching step (step C). Thus, it is possible to improve an reaction efficiency of the etching gas at the same etching film thickness. Further, as illustrated in FIG. 10D, the low-pressure etching step (step C) may be performed two or more times after performing the high-pressure etching step (step A) once. Thus, it is possible to finely control the etching film thickness and to enable a film surface treatment.

Further, in the aforementioned embodiments, although the ZrO film is exemplified as the oxide film of high dielectric constant to be etched, the present disclosure is not limited thereto but it may be any oxide (including mixed oxide) as long as bonding energy of such oxide is lower than that of ZrO or a vapor pressure of such oxide is higher than that of Zr chloride. For example, the present disclosure may be similarly applied to a case where $ZrO_y$, $HfO_y$, $Al_xO_y$, $HfSi_xO_y$, $HfAl_xO_y$, $ZrSiO_y$, $ZrAlO_y$, $Ti_xO_y$, or $Ta_xO_y$ (where x and y are integers or decimal numbers greater than 0) is used as an oxide of high dielectric constant. That is, the present disclosure may be applied to a zirconium oxide film, a hafnium oxide film, an aluminum oxide film, a titanium oxide film, a tantalum oxide film, and a composite film thereof.

Further, in the aforementioned embodiments, the etching of the process chamber (the process vessel) to which the oxide film of high dielectric constant adheres has been described but the embodiments may also apply to an etching of a process chamber to which an oxide film other than the oxide film of high dielectric constant adheres. In this case, the oxide film may include, for example, a SiO film, a GeO film, and the like. Further, the present disclosure may be applied to etching of a process chamber in which an oxynitride film such as a SiON film is formed. Further, the present disclosure may be applied to etching of a process chamber to which a film containing oxygen and carbon such as a SiOC film and a SiOCN film adheres. The present disclosure may be applied to a film containing a X—O bond. In this case, X is Si, Ge, a metal element (Zr, Hf, Al, Ti, Ta, Mo, or W), and the like. In some embodiments, X may be an oxide film of a transition element. In the case of a metal oxide film or an oxide film of a transition element, only the film adhering to the process vessel may be etched easily from the process vessel with a difference in etching rate from the process vessel or characteristics of bonding energy.

Further, in the aforementioned embodiments, TEMAZ is exemplified as the organic precursor, but the present disclosure is not limited thereto and other precursors may be applied as long as they are organic compounds. For example, an organic Hf precursor such as tetrakis(ethylmethylamino) hafnium ($Hf[N(CH_3)CH_2CH_3]_4$, abbreviation: TEMAH), an organic Al precursor such as a trimethylaluminum (($CH_3$)$_3$Al, abbreviation: TMA), an organic Si precursor such as tris(dimethylamino)silane ($SiH(N(CH_3)_2)_3$, abbreviation: TDMAS), an organic Ti precursor such as tetrakis(dimethylamino)titanium ($Ti[N(CH_3)_2]_4$, abbreviation: TDMAT), an organic Ta precursor such as pentakis(dimethylamino) tantalum ($Ta(N(CH_3)_2)_5$, abbreviation: PDMAT), or the like may also be applied.

Further, in the aforementioned embodiments, there have been described examples in which the $COCl_2$ gas is used as the chlorine-containing gas as the etching gas and as the gas containing a carbonyl group ($>C=O$), but the present disclosure is not limited thereto. For example, a gas containing halogen (chlorine, bromine, iodine or fluorine) and a carbonyl group ($>C=O$) or a thionyl group ($>S=O$) may be used as the etching gas. For example, $COBr_2$, $COI_2$, $SOI_2$, $SOCl_2$, $SO_2Cl_2$, or the like is used as such a gas. Radicals having a strong reducing action, such as $CO^*$, $SO^*$ or $SO_2^*$, may be generated by such a gas, and thus oxygen (O) atoms in the film may be extracted. Further, a gas having a carbonyl group or a thionyl group may be used as the etching gas in some embodiments. As long as the gas has such a double bond, bond of a single-bond portion is easily broken, whereby such radicals may be easily generated. For example, $CO^*$ and $Cl_2$ are generated in $COCl_2$, and $SO^*$ and $Cl_2$ are generated in $SOCl_2$.

Further, in the aforementioned embodiments, there have been described examples in which the $O_3$ gas) is used in the film-forming process but the present disclosure is not limited thereto, and other precursors may also be applied as long as they are oxygen-containing gases. For example, $O_2$, $O_2$ plasma, $H_2O$, $H_2O_2$, $N_2O$, or the like may also be applied.

Further, in the aforementioned embodiments, $O_3$ is exemplified as the oxidizing gas used at the surface oxidization step, but other gases may be applied as long as they are oxygen-containing gases. For example, $O_2$, $O_2$ plasma, $H_2O$, $H_2O_2$, $N_2O$, or the like may also be applied.

Further, in the aforementioned embodiments, $H_2O$ is exemplified as the modifying gas used at the post-processing step, but other gases may be applied, as long as they are gases containing an element reacting with a halogen element contained in the etching gas. For example, $H_2O_2$, $H_2$, $NH_3$, or the like may also be applied.

Moreover, in the aforementioned embodiments, $O_3$ is exemplified as the oxidizing gas used at the surface oxidization step, and $H_2O$ is exemplified as the modifying gas used at the post-processing step, but the present disclosure is not limited thereto and the same gas may be used at both steps as long as the gas is an oxygen-containing gas and contains an element reacting with an halogen element contained in the etching gas. For example, $H_2O$, $H_2O_2$, or the like may also be used at both steps.

Process recipes (programs in which processing sequences and processing conditions are described) used to form these various types of thin films may be provided individually (in a plural number) according to contents of substrate processing, cleaning process or the like (type, composition ratio, quality, thickness, processing procedure, processing condition, and the like of the thin film to be formed). Further, at the start of substrate processing, cleaning process or the like, an appropriate process recipe, cleaning recipe, and the like may be properly selected from the process recipes, cleaning recipes, and the like according to contents of the substrate processing, cleaning process or the like. Specifically, the process recipes, cleaning recipes, and the like provided individually according to the contents of the substrate processing, cleaning process, and the like may be stored (installed) in advance in the memory 280c of the substrate processing apparatus via a telecommunication line or a recording medium (external memory 283) storing the process recipes, cleaning recipes, and the like. Further, at the start of the substrate processing, the CPU 280a of the substrate processing apparatus may properly select an appropriate process recipe, cleaning recipe, and the like from the process recipes, the cleaning recipes, and the like stored in the memory 280c according to the contents of the substrate processing. With this configuration, it is possible for a single substrate processing apparatus to form thin films of different types, composition ratios, qualities and thicknesses for wide use and with enhanced reproducibility. In addition, it is possible to reduce an operator's operation burden (for example, a burden to an operator when inputting processing procedures, processing conditions, and the like), thereby quickly starting the substrate processing while avoiding an operation error.

Furthermore, the present disclosure may be realized by, for example, modifying the existing process recipes, cleaning recipes, and the like in the substrate processing apparatus. When modifying the process recipes, cleaning recipes, and the like, the process recipes, the cleaning recipes, and the like according to the present disclosure may be installed in the existing substrate processing apparatus via a telecommunication line or a recording medium storing the process recipes, cleaning recipes, and the like, or the process recipes, cleaning recipes, and the like themselves may be modified into the process recipes, cleaning recipes, and the like according to the present disclosure by operating the input/output device of the existing substrate processing apparatus.

According to some embodiments of the present disclosure, it is possible to provide a cleaning technique capable of efficiently removing a film such as an oxide film which is difficult to etch with a fluorine-containing gas.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   forming an oxide film on a substrate accommodated in a process vessel; and
   removing the oxide film which adheres to an interior of the process vessel,
   wherein the act of removing the oxide film comprises:
   (a) supplying a chlorine-containing gas to an interior of a process vessel, to which an oxide film adheres, under a first pressure;
   (b) exhausting the interior of the process vessel;
   (c) supplying an oxygen-containing gas into the process vessel;
   (d) exhausting the interior of the process vessel;
   (e) supplying the chlorine-containing gas into the process vessel under a second pressure lower than the first pressure;
   (f) exhausting the interior of the process vessel;

(g) supplying the oxygen-containing gas into the process vessel; and
(h) exhausting the interior of the process vessel,
wherein the oxide film which adheres to the interior of the process vessel is removed by performing (a) to (h) non-simultaneously in this order and setting a supply amount of the oxygen-containing gas in (c) different from a supply amount of the oxygen-containing gas in (g),
wherein the supply amount of the oxygen-containing gas in (g) is set smaller than the supply amount of the oxygen-containing gas in (c), and
wherein a supply time of the oxygen-containing gas in (g) is set shorter than a supply time of the oxygen-containing gas in (c).

2. A cleaning method, comprising:
(a) supplying a chlorine-containing gas to an interior of a process vessel, to which an oxide film adheres, under a first pressure;
(b) exhausting the interior of the process vessel;
(c) supplying an oxygen-containing gas into the process vessel;
(d) exhausting the interior of the process vessel;
(e) supplying the chlorine-containing gas into the process vessel under a second pressure lower than the first pressure;
(f) exhausting the interior of the process vessel;
(g) supplying the oxygen-containing gas into the process vessel; and
(h) exhausting the interior of the process vessel,
wherein the oxide film which adheres to the interior of the process vessel is removed by performing (a) to (h) non-simultaneously in this order and setting a supply amount of the oxygen-containing gas in (c) different from a supply amount of the oxygen-containing gas in (g),
wherein the supply amount of the oxygen-containing gas in (g) is set smaller than the supply amount of the oxygen-containing gas in (c), and
wherein a supply time of the oxygen-containing gas in (g) is set shorter than a supply time of the oxygen-containing gas in (c).

3. The cleaning method according to claim 2, wherein after (a) to (d) are repeatedly performed a predetermined number of times, (e) to (h) are repeatedly performed a predetermined number of times.

4. The cleaning method according to claim 2, wherein after (e) to (h) are performed, (a) to (d) are performed.

5. The cleaning method according to claim 2, wherein after (a) to (d) are repeatedly performed two or more times, (e) to (h) are performed.

6. The cleaning method according to claim 2, wherein after (a) to (d) are performed, (e) to (h) are repeatedly performed two or more times.

7. The cleaning method according to claim 2, wherein supplying the chlorine-containing gas into the process vessel is performed between (a) and (e) under a third pressure between the first pressure and the second pressure.

8. The cleaning method according to claim 2, wherein the chlorine-containing gas contains C or S.

9. The cleaning method according to claim 2, wherein the chlorine-containing gas has a double bond.

10. The cleaning method according to claim 2, wherein the chlorine-containing gas contains at least one selected from the group of $COCl_2$ and $SOCl_2$.

11. The cleaning method according to claim 2, wherein an exhaust flow rate of the interior of the process vessel is reduced during the supply of the chlorine-containing gas in (a) or an exhaust flow rate of the interior of the process vessel is reduced during the supply of the chlorine-containing gas in (e).

12. The cleaning method according to claim 2, wherein in (a) and (e), the chlorine-containing gas is activated.

13. The cleaning method according to claim 2, wherein the oxygen-containing gas contains at least one selected from the group of $O_2$, $O_2$ plasma, $H_2O$, $H_2O_2$, $N_2O$, and $O_3$.

14. The cleaning method according to claim 2, wherein the oxide film is an oxide film of high dielectric constant.

15. A substrate processing apparatus, comprising:
a process vessel in which a substrate is processed;
a gas supply system configured to supply a chlorine-containing gas and an oxygen-containing gas into the process vessel;
an exhaust system configured to exhaust an internal atmosphere of the process vessel; and
a controller configured to be control the gas supply system and the exhaust system to perform a process, the process comprising:
(a) supplying the chlorine-containing gas to an interior of the process vessel, to which an oxide film adheres, under a first pressure;
(b) exhausting the interior of the process vessel;
(c) supplying the oxygen-containing gas into the process vessel;
(d) exhausting the interior of the process vessel;
(e) supplying the chlorine-containing gas into the process vessel under a second pressure lower than the first pressure;
(f) exhausting the interior of the process vessel;
(g) supplying the oxygen-containing gas into the process vessel; and
(h) exhausting the interior of the process vessel,
wherein the oxide film which adheres to the interior of the process vessel is removed by performing (a) to (h) non-simultaneously in this order and setting a supply amount of the oxygen-containing gas in (c) different from a supply amount of the oxygen-containing gas in (g),
wherein the supply amount of the oxygen-containing gas in (g) is set smaller than the supply amount of the oxygen-containing gas in (c), and
wherein a supply time of the oxygen-containing gas in (g) is set shorter than a supply time of the oxygen-containing gas in (c).

* * * * *